(12) United States Patent
Byeon et al.

(10) Patent No.: US 7,449,944 B2
(45) Date of Patent: Nov. 11, 2008

(54) INTERNAL VOLTAGE GENERATOR

(75) Inventors: Sang-Jin Byeon, Ichon-shi (KR); Jae-Jin Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 259 days.

(21) Appl. No.: 11/321,873

(22) Filed: Dec. 30, 2005

(65) Prior Publication Data

US 2006/0244518 A1 Nov. 2, 2006

(30) Foreign Application Priority Data

Apr. 29, 2005 (KR) .................... 10-2005-0036243

(51) Int. Cl.
*G05F 1/563* (2006.01)
*H02M 3/18* (2006.01)

(52) U.S. Cl. .................. 327/589; 327/536; 327/537; 363/60

(58) Field of Classification Search ............. None
See application file for complete search history.

(56) References Cited

U.S. PATENT DOCUMENTS

| | | | |
|---|---|---|---|
| 6,097,161 A * | 8/2000 | Takano et al. ............ 315/291 |
| 6,097,428 A | 8/2000 | Wu et al. |
| 6,240,025 B1 | 5/2001 | Park |
| 6,297,624 B1 | 10/2001 | Mitsui et al. |
| 6,307,425 B1 * | 10/2001 | Chevallier et al. ........... 327/536 |
| 6,323,721 B1 | 11/2001 | Proebsting |
| 6,326,834 B1 * | 12/2001 | Akita et al. ............... 327/536 |

(Continued)

FOREIGN PATENT DOCUMENTS

JP 10-125097 5/1998

(Continued)

OTHER PUBLICATIONS

English Translation of Taiwanese Office Action and Search Report issued in Taiwanese Patent Application No. 09147414 dated on Apr. 22, 2008.

*Primary Examiner*—Lincoln Donovan
*Assistant Examiner*—Terry L Englund
(74) *Attorney, Agent, or Firm*—McDermott Will & Emery LLP

(57) ABSTRACT

An internal voltage generator includes a high efficient charge pump. The internal voltage generator includes an oscillation signal generator for receiving a reference voltage and a pumping voltage to thereby output an oscillation signal, a pump control logic for outputting a pumping control signal and a precharge signal in response to the oscillation signal, and a charge pump for precharging the pair of bootstrapping node by connecting the pair of bootstrapping node in response to the precharge signal to thereby generate the pumping voltage of a predetermined level after precharging the pair of bootstrapping node into a level of the power supply voltage and charge sharing the pair of bootstrapping node and the pumping voltage in response to the precharge signal. Herein, the pumping control signal controls a pumping operation and the precharge signal precharges a pair of bootstrapping node for generating the pumping voltage by pumping a power supply voltage.

30 Claims, 36 Drawing Sheets

U.S. PATENT DOCUMENTS

| | | |
|---|---|---|
| 6,333,873 B1 | 12/2001 | Kumanoya et al. |
| 6,535,051 B2 | 3/2003 | Kim |
| 6,809,573 B2 | 10/2004 | Kim |
| 6,861,872 B2 | 3/2005 | Suh |
| 7,304,531 B2 * | 12/2007 | Kim ............................ 327/536 |
| 2004/0232957 A1 | 11/2004 | Do |

FOREIGN PATENT DOCUMENTS

| | | |
|---|---|---|
| KR | 1999-0061048 | 7/1999 |
| KR | 2001-0003414 | 1/2001 |
| TW | I222081 | 10/2004 |

* cited by examiner

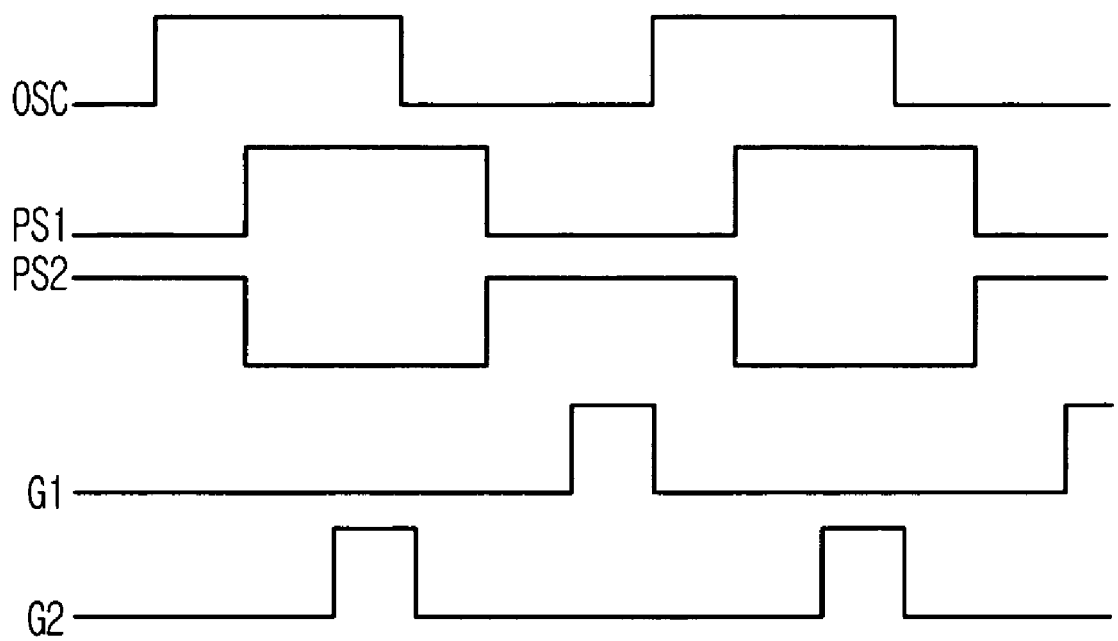

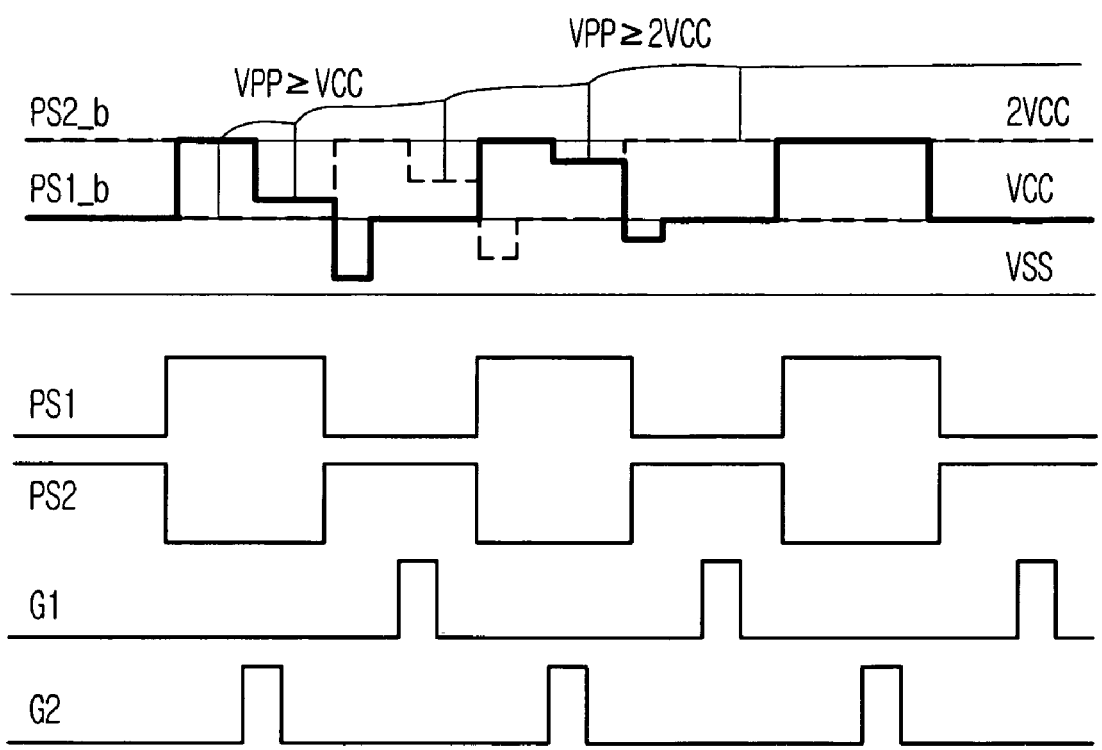

INTERNAL VOLTAGE GENERATOR

FIELD OF THE INVENTION

The present invention relates to an internal voltage generator; and, more particularly, to an internal voltage generator including a high efficient charge pump.

DESCRIPTION OF RELATED ARTS

The present application contains subject matter related to Korean patent application No. 2005-36243, filed in the Korean Patent Office on Apr. 29, 2005, the entire contents of which are incorporated herein by reference.

Generally, a DRAM supplies a pumping voltage VPP which is higher than a power supply voltage VCC to a word line, i.e., a gate of a cell transistor, to thereby increase a transmission speed of a cell data without any data distortion. Further, a back bias voltage VBB lower than a ground voltage VSS is supplied to a bulk of the cell transistor of the DRAM because of the abovementioned reason.

The pumping voltage VPP and the back bias voltage VBB are generated by a charge pump. Therefore, a performance of the charge pump is critical for generating the pumping voltage VPP and the back bias voltage VBB.

FIG. 1 is a block diagram describing a conventional pumping voltage generator.

As shown, the conventional pumping voltage VPP generator includes a level shifter 1, a VPP level detector 2, a ring oscillator 3, a pump control logic 4, and a doubler charge pump 5.

The level shifter 1 outputs a shifted reference voltage VR1 by shifting a voltage level of a reference voltage VREF. The VPP level detector 2 detects a level of the pumping voltage VPP in response to the shifted reference voltage VR1 to thereby output a pumping enable signal PPE. The ring oscillator 3 generates an oscillation signal OSC in response to the pumping enable signal PPE. The pump control logic 4 generates pumping control signals PS1, PS2, G1, and G2 in response to the oscillation signal OSC. The doubler charge pump 5 generates the pumping voltage VPP in response to the control signals PS1, PS2, G1, and G2 to thereby transmit the pumping voltage VPP to the VPP level detector 2.

FIG. 2A is a schematic circuit diagram describing the pump control logic 4 shown in FIG. 1, and FIG. 2B is a waveform demonstrating an operation thereof.

As shown in FIG. 2A, the pump control logic 4 is provided with eight inverters INV1 to INV8 and two NAND gates ND1 and ND2. The pump control logic 4 generates the pumping control signals PS1, PS2, G1, G2 shown in FIG. 2B in response to the oscillation signal OSC.

FIG. 3A is a schematic circuit diagram describing the doubler charge pump 5 shown in FIG. 1, and FIG. 3B is a waveform demonstrating an operation thereof.

As shown in FIG. 3A, the doubler charge pump 5 includes seven NMOS transistors N1 to N7, two PMOS transistors P1 and P2, and four MOS capacitors MC1 to MC4.

The doubler charge pump 5 performs a pumping operation in response to the pumping control signals PS1, PS2, G1, and G2 to thereby increase the pumping voltage VPP level. When the pumping voltage VPP level reaches a target voltage level, the VPP level detector 2 sets the pumping enable signal to a logic level 'L' to thereby stop the pumping operation.

An electric charge generated through the pumping operation is stored in the MOS capacitors MC1 to MC4 connected between the pumping voltage VPP and the ground voltage VSS. The electric charge stored in the MOS capacitors MC1 to MC4 is maintained a constant value and used for driving the word line. When the word line is driven by the electric charges stored in the MOS capacitors MC1 to MC4, the pumping voltage VPP level decreases. When voltage VPP decreases to a specified level, the VPP level detector 2 activates the pumping enable signal to a logic level 'H' to thereby operate the charge pump 5.

Referring to FIG. 3B, when the first control signal PS1 changes from the ground voltage VSS level to a power supply voltage VCC level, a level of a first bootstrapping node PS1_b changes from the power supply voltage VCC level to 2VCC. The 2VCC level is twice, or double, the power supply voltage level VCC. Then, the second pumping signal PS2 changes from the power supply voltage VCC level to the ground voltage VSS level. Therefore, a second bootstrapping node PS2_b is changed from the double power supply voltage 2VCC level to the power supply voltage VCC level.

The electric charge in the first bootstrapping node PS1__b is transmitted to a pumping voltage VPP terminal through the first PMOS transistor P1. As a result, the pumping voltage VPP level becomes stable after the first bootstrapping node PS1__b and the pumping voltage VPP are charge shared.

When a second precharge control signal G2 changes from the ground voltage VSS level to the power supply voltage VCC level, a voltage at a second precharge node G2__b is bootstrapped. Then, the voltage at the second precharge node G2__b changes from the power supply voltage VCC level to the double power supply voltage 2VCC level. The third NMOS transistor N3 is turned on in response to the voltage at the second precharge node G2__b. Therefore, the second bootstrapping node PS2__b is precharged with the power supply voltage VCC level.

When the second precharge control signal G2 changes from the power supply voltage VCC level to the ground voltage VSS level, the voltage at the second precharge node G2__b reaches the power supply voltage VCC level. Therefore, the third NMOS transistor N3 is turned off.

After the first pumping control signal PS1 changes from the power supply voltage VCC level to the ground voltage VSS level, the voltage of first bootstrapping node PS1__b becomes the power supply voltage VCC level. Also, the second pumping control signal PS2 is changed from the ground voltage VSS level to the power supply voltage VCC level. Thus, the electric charge is shared between the second bootstrapping node PS2__b and the pumping voltage VPP terminal through the second PMOS transistor P2.

After a predetermined time, a first precharge control signal G1 is changed from the ground voltage VSS level to the power supply voltage VCC level. Then, a voltage level of a third bootstrapping node G1__b is changed from the power supply voltage VCC level to the double power supply voltage 2VCC level. The second NMOS transistor N2 is turned on in response to the voltage of the first precharge node G1__b to thereby precharge the first bootstrapping node PS1__b with the power supply voltage VCC level.

When the first precharge control signal G1 changes from the power supply voltage VCC level to the ground voltage VSS level, the voltage of the first precharge node G1__b becomes the power supply voltage VCC level to thereby turn off the second NMOS transistor N2.

As shown in FIG. 3B, the voltages of the first and the second bootstrapping nodes PS1__b and PS2__b only can be bootstrapped to the double power supply voltage 2VCC level. The precharge level of the doubler charge pump 5 is the power supply voltage VCC level. Therefore, the pumping voltage VPP level can be, at maximum, the double power supply voltage 2VCC level.

Generally, a current efficiency of the doubler VPP charge pump 5 is defined by an equation ((2VCC−VPP)×C/2VCC× C)×100) level. Herein, C denotes a capacitance of the first and the second bootstrapping nodes PS1_*b* and PS2_*b*. For example, when the power supply voltage VCC is 2.5V and the target level of the pumping voltage VPP is 3.5V, the current efficiency becomes 30%. The theoretical maximum value of the pumping value VPP is the double power supply voltage 2VCC. Therefore, when the power supply voltage VCC is 2.5V, the theoretical maximum value of the pumping value VPP is 5V. That is, the current efficiency is generated by dividing the electric charge of the pumping voltage VPP by the electric charge of the power supply voltage VCC.

FIG. 4 is a block diagram describing a conventional back bias voltage generator.

As shown, the conventional back bias current generator includes a level shifter 6, a VBB level detector 7, a ring oscillator 8, a pump control logic 9, and a doubler charge pump 10.

The level shifter 6 outputs a shifted reference voltage VR1 by level shifting a reference voltage VREF. The VBB level detector 7 detects a level of the back bias voltage VBB in response to the shifted reference voltage VR1 to thereby output a back bias enable signal BBE. The ring oscillator 8 generates an oscillation signal OSC in response to the back bias enable signal BBE. The pump control logic 9 generates pumping control signals PS3, PS4, G3, and G4 in response to the oscillation signal OSC. The doubler charge pump 10 generates the back bias voltage VBB in response to the pumping control signals PS3, PS4, G3, and G4 to thereby transmit the back bias voltage VBB to the VBB level detector 7.

FIG. 5A is a schematic circuit diagram describing the pump control logic 9 shown in FIG. 4, and FIG. 5B is a waveform demonstrating an operation thereof.

As shown in FIG. 5A, the pump control logic 9 includes seven inverters INV9 to INV16 and two NAND gates ND3 and ND4. The pump control logic 9 generates the pumping control signals PS3, PS4, G3, G4 shown in FIG. 5B in response to the oscillation signal OSC.

The third precharge charge control signal G3 changes from the power supply voltage VCC level to ground voltage VSS level while the third pumping control signal PS3 is up to a power supply voltage VCC level to thereby precharge a bootstrapping node. The fourth precharge control signal G4 maintains the power supply voltage VCC level. The fourth precharge control signal G4 is changes from the power supply voltage VCC level into ground voltage VSS level while the fourth pumping control signal PS4 is up to a power supply voltage VCC level to thereby precharge the bootstrapping node. At this time, the third precharge control signal holds the power supply voltage VCC level.

FIG. 6A is a schematic circuit diagram describing doubler charge pump 10 shown in FIG. 4, and FIG. 6B is a waveform demonstrating an operation thereof.

As shown in FIG. 6A, the doubler charge pump 10 includes three NMOS transistors N8 to N10, six PMOS transistors P3 and P8, and four MOS capacitors MC5 to MC8.

The doubler charge pump 10 performs a pumping operation in response to the pumping control signals PS3, PS4, G3, and G4 to thereby decrease the back bias voltage VBB level. Then, when the back bias voltage VBB level arrives at the target voltage level, the VBB level detector 7 sets the back bias enable signal BBE to the logic level 'H' to thereby stop the pumping operation.

Referring to FIG. 6B, when the third control signal PS3 changes from the ground voltage VSS level to a power supply voltage VCC level, the level of third bootstrapping node PS3_*b* changes from a negative power supply voltage −VCC level to the ground voltage VSS level to thereby turn on the tenth NMOS transistor N10.

Concurrently, the fourth pumping signal PS4 changes from the power supply voltage VCC level to the ground voltage VSS level. Then, the level of a fourth bootstrapping node PS4_*b* changes from the ground voltage VSS level to the negative power supply voltage −VCC level. The electric charge in the fourth bootstrapping node PS4_*b* is charge-shared to a back bias voltage VBB terminal. After a predetermined time, the back bias voltage VBB and the third bootstrapping node PS3_*b* arrives at a stable state.

When the third precharge control signal G3 changes from the power supply voltage VCC level to the ground voltage VSS level, the third PMOS transistor P3 is turned on to thereby precharge a third bootstrapping node G3_*b* with the ground voltage VSS level. Therefore, the tenth NMOS transistor N10 is turned off.

After the fourth pumping control signal PS4 changes from the ground voltage VSS level to the power supply voltage VCC level, the voltage loaded in the fourth bootstrapping node PS4_*b* is bootstrapped to the ground voltage VSS level. Therefore, the ninth NMOS transistor N9 is turned on in response to the voltage of the fourth bootstrapping node PS4_*b*.

Concurrently, the third pumping control signal PS3 changes from the power supply voltage VCC level to the ground voltage VSS level, the voltage of third bootstrapping node PS3_*b* is bootstrapped to the negative power supply voltage −VCC level. Then, the electric charge in the third bootstrapping node PS3_*b* is charge shared to a back bias voltage VBB terminal.

After a predetermined time, a fourth precharge control signal G4 is changed from the power supply voltage VCC level to the ground voltage VSS level, and the fourth PMOS transistor P4 is turned on to thereby precharge the fourth bootstrapping node G4_*b* to the ground voltage VSS level. Therefore, the ninth NMOS transistor N9 is turned off.

As shown in FIG. 6B, the voltages of the third and the fourth bootstrapping nodes PS3_*b* and PS4_*b* only can be a negative power supply voltage −VCC level.

Generally, a current efficiency of the doubler VBB charge pump 10 is defined by an equation ((−VCC−VBB)×C/−VCC×C)×100.

Herein, C denotes a capacitance of the third and the fourth bootstrapping nodes PS3_*b* and PS4_*b*. For example, when the power supply voltage VCC is 2.5V and the target level of the back bias voltage VBB is −1V, the current efficiency becomes 60%. The theoretical maximum absolute value of the back bias value VBB is the negative power supply voltage −VCC level. Therefore, when the power supply voltage VCC is 2.5V, the theoretical maximum absolute value of the back bias value VBB is −2.5V. That is, the current efficiency is generated by dividing the electric charge of the back bias voltage VBB by the electric charge of the power supply voltage VCC.

FIG. 7 is a block diagram describing a conventional tripler pumping voltage generator.

As shown, the conventional tripler pumping voltage generator includes a level shifter 11, a VPP level detector 12, a ring oscillator 13, a pump control logic 14, and a tripler charge pump 15. Herein, the level shifter 11, the VPP level detector 12, and the ring oscillator 13 are similar to those shown in FIG. 1.

FIG. 8A is a schematic circuit diagram describing the pump control logic 14 shown in FIG. 7, and FIG. 8B is a waveform demonstrating an operation thereof.

As shown in FIG. 8A, the pump control logic 14 is provided with fourteen inverters INV17 to INV30 to thereby output the pumping control signals PS5 to PS6b and G5 to G7b shown in FIG. 8B in response to the oscillation signal OSC. Herein, the pumping control signals PS5b, PS6b, G5b, G6b, and G7b have the same timing but an opposite phase with those of the pumping control signals PS5, PS6, G5, G6, and G7.

FIGS. 9A and 9B are schematic circuit diagrams of the tripler charge pump 15 shown in FIG. 7 in accordance with a first and a second embodiment.

As shown in FIG. 9A, the tripler charge pump 15A of the first embodiment is provided with six NMOS transistors N11 to N16, ten MOS capacitors MC9 to MC18, and two capacitors C1 and C2.

As shown in FIG. 9B, the tripler charge pump 15B of the second embodiment includes six PMOS transistors P9 to P14, ten MOS capacitors MC19 to MC28, six inverters INV31 to INV36, and two capacitors C3 and C4.

FIGS. 10A and 10B are waveforms demonstrating an operation of tripler charge pump 15A shown in FIG. 9A.

First, the fifth precharge control signal G5 changes from the ground voltage VSS level to the power supply voltage VCC level to thereby turn on the eleventh NMOS transistor N11. The fifth pumping control signal PS5 is changed from the ground voltage VSS level into the power supply voltage VCC level and, therefore, a voltage loaded in a fifth bootstrapping node PS5_b becomes the negative power supply voltage –VCC level. Then, the voltage loaded in the fifth bootstrapping node PS5_b is precharged with the external voltage VCC level.

When the fifth precharge control signal G5 changes from the power supply voltage VCC level to the ground voltage VSS, the eleventh NMOS transistor N11 is turned off. The fifth pumping control signal PS5 is changed from the ground voltage VSS level to the power supply voltage VCC level and, therefore, the voltage loaded in the fifth bootstrapping node PS5_b becomes the double power supply voltage 2VCC level.

When the sixth precharge control signal G6 is changed from the ground voltage VSS level to the power supply voltage VCC level, the twelfth NMOS transistor N12 is turned on. Then, the sixth pumping control signal PS6 is changed from the power supply voltage VCC level into the ground voltage VSS level and, therefore, the voltage loaded in the sixth bootstrapping node PS6_b becomes the negative power supply voltage –VCC level.

Afterward, the voltage loaded in the sixth bootstrapping node PS6_b is precharged with the voltage loaded in the fifth bootstrapping node PS5_b to thereby change to the power supply voltage VCC level. Then, the sixth precharge control signal G6 is changed from the power supply voltage VCC level to the ground voltage VSS level to thereby turn off the twelfth NMOS transistor N12. When the sixth pumping control signal PS6 is changed from the ground voltage VSS level to the power supply voltage VCC level, consequently, the voltage loaded in the sixth bootstrapping node PS6_b becomes the double power supply voltage 2VCC level.

When the seventh precharge control signal G7 is changed from the ground voltage VSS level to the power supply voltage VCC level, the thirteenth NMOS transistor N13 is turned on. Accordingly, the pumping voltage VPP is charge shared with the voltage loaded in the sixth bootstrapping node PS6_b.

According to the operation of the tripler charge pump 15A shown in FIG. 9A, the voltage loaded in the fifth bootstrapping node PS5_b can be increased into the double power supply voltage 2VCC level; and the voltage loaded in the sixth bootstrapping node PS6_b can be increased into a triple power supply voltage 3VCC level.

The pumping control signals G5b, G6b, G7b, PS5b, and PS6b, each having an opposite phase with the pumping control signals G5, G6, G7, PS5, and PS6, are used for a charge pumping operation with the pumping control signals G5, G61 G7, PS5, and PS6. That is, the control signals G5, G6, G7, PS5, and PS6 and the control signals G5b, G6b, G7b, PS5b, and PS6b are alternately used for providing the pumping voltage VPP with the electric charge.

In the conventional tripler charge pump 15, because the precharge voltage level of the voltages loaded in the fifth and the sixth bootstrapping nodes PS5_b and PS6_b are the power supply voltage VCC level and the double power supply voltage 2VCC level, respectively, the maximum level of the voltages loaded in the fifth and the sixth bootstrapping nodes PS5_b and PS6_b can be the double power supply voltage 2VCC level and the triple power supply voltage 3VCC.

As shown in FIGS. 10A and 10B, the fifth pair of bootstrapping node PS5_b and PS5b_b only can be bootstrapped into the double power supply voltage 2VCC level and, further, can be precharged with the power supply voltage VCC level. Consequently, the sixth pair of bootstrapping node PS6_b and PS6b_b only can be bootstrapped into the triple power supply voltage 3VCC level and, further, can be precharged with the double power supply voltage 2VCC level. As a result, the sixth pair of bootstrapping node PS6_b and PS6b_b generate the pumping voltage VPP of the triple power supply voltage 3VCC level.

The tripler charge pump 15B shown in FIG. 9B performs the same operation with the tripler charge pump 15A.

Generally, a current efficiency of the tripler VPP charge pump 15 is defined by an equation ((3VCC–VPP)×C/3VCC×C)×100. Herein, C denotes a capacitance of the bootstrapping nodes PS5_b, PS5b_b, PS6_b, and PS6b_b. For example, when the power supply voltage VCC is 1.5V and the target level of the pumping voltage VPP is 3.5V, the current efficiency becomes 22%. The theoretical maximum absolute value of the pumping value VPP is the triple power supply voltage 3VCC level. Therefore, when the power supply voltage VCC is 1.5V, the theoretical maximum value of the pumping value VPP is 4.5V. That is, the current efficiency is generated by dividing the electric charge of the pumping voltage VPP by the electric charge of the power supply voltage VCC.

FIG. 11 is a block diagram describing a conventional tripler back bias voltage generator.

The conventional tripler back bias voltage generator includes a level shifter 16, a VBB level detector 17, a ring oscillator 18, a pump control logic 19, and tripler charge pump 20. Herein, the level shifter 16, the VBB level detector 17, and the ring oscillator 18 are similar to those shown in FIG. 4.

FIG. 12A is a schematic circuit diagram describing the pump control logic 19 shown in FIG. 11, and FIG. 12B is a waveform demonstrating an operation thereof, respectively.

As shown in FIG. 12A, the pump control logic 19 is provided with fourteen inverters INV37 to INV50 to thereby output the pumping control signals PS7 to PS8b and G8 to G10b shown in FIG. 12B in response to the fourth oscillation signal OSC. The pumping control signals PS7b, PS8b, G8b, G9b, and G10b are in opposite phase with those of the pumping control signals PS7, PS8, G8, G9, and G10.

FIGS. 13A and 13B are schematic circuit diagrams of the tripler charge pump 20 shown in FIG. 11 in accordance with a first and a second embodiments, respectively.

As shown in FIG. 13A, a first tripler charge pump 20A is provided with six NMOS transistors N17 to N22, ten MOS capacitors MC29 to MC38, and two capacitors C5 and C6. As shown in FIG. 13B, a second tripler charge pump 20B includes six PMOS transistors P15 to P20, ten MOS capacitors MC39 to MC48, six inverters INV51 to INV56, and two capacitors C7 and C8.

FIGS. 14A and 14B are waveforms demonstrating an operation of the tripler charge pump 20A shown in FIG. 13A.

The eighth precharge control signal G8 changes from the ground voltage VSS level to the power supply voltage VCC level to thereby turn on the seventeenth NMOS transistor N17. The seventh pumping control signal PS7 is changed from the ground voltage VSS level into the power supply voltage VCC level and, therefore, a voltage loaded in a seventh bootstrapping node PS7_b becomes the power supply voltage VCC. Then, the voltage loaded in the seventh bootstrapping node PS7_b is precharged with the ground voltage VSS level.

When the eighth precharge control signal G8 is changed from the power supply voltage VCC level into the ground voltage VSS, the seventeenth NMOS transistor N17 is turned off. Then, the seventh pumping control signal PS7 is changed from the ground voltage VSS level to the power supply voltage VCC level and, therefore, the voltage loaded in the seventh bootstrapping node PS7_b becomes the negative power supply voltage −VCC level.

When the ninth precharge control signal G9 is changed from the ground voltage VSS level into the power supply voltage VCC level, the eighteenth NMOS transistor N18 is turned on. Then, the eighth pumping control signal PS8 is changed from the ground voltage VSS level to the power supply voltage VCC level and, therefore, the voltage loaded in the eighth bootstrapping node PS8_b becomes the ground voltage VSS level.

Then, the ninth precharge control signal G9 is changed from the power supply voltage VCC level into the ground voltage VSS level to thereby turn off the eighteenth NMOS transistor N18. When the eighth pumping control signal PS8 is changed from the power supply voltage VCC level to the ground voltage VSS level, consequently, the voltage loaded in the eighth bootstrapping node PS8_b becomes the negative power supply voltage −VCC level.

Further, when the tenth precharge control signal G10 is changed from the ground voltage VSS level to the power supply voltage VCC level, the nineteenth NMOS transistor N19 turned on. Accordingly, the back bias voltage VBB is charge shared with the voltage loaded in the eighth bootstrapping node PS8_b. Therefore, the back bias voltage VBB level becomes lower than the ground voltage VSS level.

According to the operation of the tripler charge pump 20A shown in FIG. 13A, the voltage loaded in the seventh bootstrapping node PS7_b can be decreased into the negative power supply voltage −VCC level; and the voltage loaded in the eighth bootstrapping node PS8_b can be decreased into a double negative power supply voltage −2VCC level.

The pumping control signals G8b, G9b, G10b, PS7b, and PS8b, each having an opposite phase with the pumping control signals G8, G9, G10, PS7, and PS8, are used for a charge pumping operation with the pumping control signals G8, G9, G10, PS7, and PS8. That is, the control signals G8, G9, G10, PS7, and PS8 and the control signals G8b, G9b, G10b, PS7b, and PS8b are alternately used for providing the back bias voltage VBB with the electric charge.

In the conventional tripler charge pump 20, because the precharge voltage level of the seventh and the eighth bootstrapping nodes PS7_b and PS8_b are the ground voltage VSS level and the negative power supply voltage −VCC level respectively, the maximum level of the voltages loaded in the fifth and the sixth bootstrapping nodes PS7_b and PS8_b can be the negative power supply voltge −VCC level and the double negative power supply voltage −2VCC level.

As shown in FIGS. 14A and 14B, the seventh pair of bootstrapping node PS7_b and PS7b_b only can be bootstrapped into the negative power supply voltage −VCC level and, further, can be precharged with the ground voltage VSS level. Consequently, the eighth pair of bootstrapping node PS8_b and PS8b_b only can be bootstrapped into the double negative power supply voltage −2VCC level and, further, can be precharged with the negative power supply voltage −VCC level. As a result, the eighth pair of bootstrapping node PS8_b and PS8b_b generate the back bias voltage VBB of the double negative power supply voltage −2VCC level.

Also, the tripler charge pump 20B shown in FIG. 13B performs the abovementioned operation. That is, the tripler charge pumps 20A and 20B perform the same operation.

Generally, a current efficiency of the tripler VBB charge pump 20 is defined by an equation ((−2VCC−VBB)×C/−2VCC×C)×100. Herein, C denotes a capacitance of the bootstrapping nodes PS7_b, PS7b_b, PS8_b, and PS8b_b. For example, when the power supply voltage VCC is 1.5V and the target level of the back bias voltage VBB is −2V, the current efficiency becomes 33%. The theoretical maximum absolute value of the pumping value VPP is the triple power supply voltage −3V. Therefore, when the power supply voltage VCC is 1.5V, the theoretical maximum absolute value of the back bias value VBB is −3V. That is, the current efficiency is generated by dividing the electric charge of the back bias voltage VBB by the electric charge of the power supply voltage VCC.

The abovementioned conventional internal voltage generators discharge the electric charge remained in the bootstrapping nodes after finishing the charge sharing with the pumping voltage VPP or the back bias voltage VBB. Therefore, the current efficiency of the conventional internal voltage generators is significantly low.

SUMMARY OF THE INVENTION

It is, therefore, an object of the present invention to provide an internal voltage generator including a high efficient charge pump.

In accordance with an aspect of the present invention, there is provided an internal voltage generator including an oscillation signal generation block for receiving a reference voltage and a pumping voltage to thereby output an oscillation signal, a pump control logic for outputting a pumping control signal and a precharge signal in response to the oscillation signal, wherein the pumping control signal controls a pumping operation and the precharge signal precharges a pair of bootstrapping nodes for generating the pumping voltage by pumping a power supply voltage, and a charge pump for precharging the pair of bootstrapping nodes by connecting the pair of bootstrapping nodes in response to the precharge signal to thereby generate the pumping voltage of a predetermined level after precharging the pair of bootstrapping nodes to a level of the power supply voltage and charge sharing the pair of bootstrapping node and the pumping voltage in response to the precharge signal.

In accordance with another aspect of the present invention, there is provided an internal voltage generator including an oscillation signal generation block for receiving a reference voltage and a back bias voltage to thereby output an oscillation signal, a pump control logic for outputting a pumping control signal and a precharge signal in response to the oscillation signal, wherein the pumping control signal controls a pumping operation and the precharge signal precharges a pair of bootstrapping nodes for generating the back bias voltage by pumping a ground voltage, and a charge pump for precharging the pair of bootstrapping nodes by connecting the pair of bootstrapping nodes in response to the precharge signal to thereby generate the back bias voltage of a predetermined level after precharging the pair of bootstrapping nodes into a level of the power supply voltage and charge sharing the pair of bootstrapping nodes and the ground voltage in response to the precharge signal.

BRIEF DESCRIPTION OF THE DRAWINGS

The above and other objects and features of the present invention will become apparent from the following description of preferred embodiments taken in conjunction with the accompanying drawings, in which:

FIG. 2B is a waveform demonstrating an operation thereof;

FIG. 3B is a waveform demonstrating an operation thereof;

DETAILED DESCRIPTION OF THE INVENTION

Hereinafter, an internal voltage generator including a high efficient charge pump in accordance with the present invention will be described in detail referring to the accompanying drawings.

Figure 15:
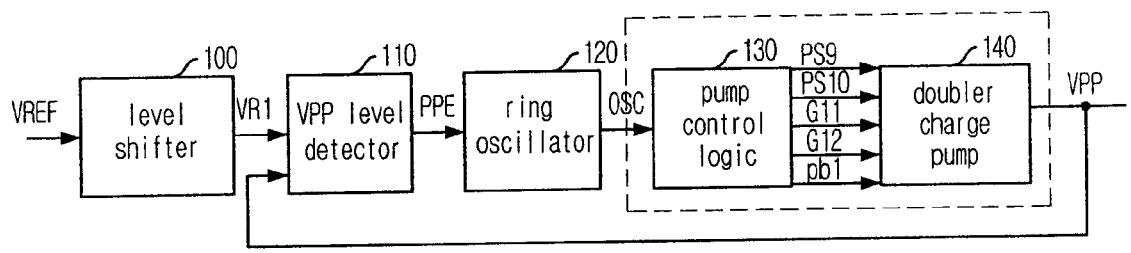
FIG. 15 is a block diagram describing a pumping voltage VPP generator in accordance with a preferred embodiment of the present invention.

FIG. 15 is a block diagram describing a pumping voltage VPP generator in accordance with a preferred embodiment of the present invention.

As shown, the pumping voltage VPP generator includes a level shifter 100, a VPP level detector 110, a ring oscillator 120, a pump control logic 130, and a doubler charge pump 140.

The level shifter 100 outputs a shifted reference voltage VR1 by shifting a level of a reference voltage VREF. The VPP level detector 110 detects a level of the pumping voltage VPP in response to the shifted reference voltage VR1 to thereby output a pumping enable signal PPE. The ring oscillator 120 generates an oscillation signal OSC in response to the pumping enable signal PPE. The pump control logic 130 generates pumping control signals PS9, PS10, G11, and G12 and a first precharge signal PB1 in response to the oscillation signal OSC. The doubler charge pump 140 generates the pumping voltage VPP in response to the control signals PS9, PS10, G11, and G12 and the first precharge signal PB1 to thereby output the pumping voltage VPP to the VPP level detector 110.

Figure 16:
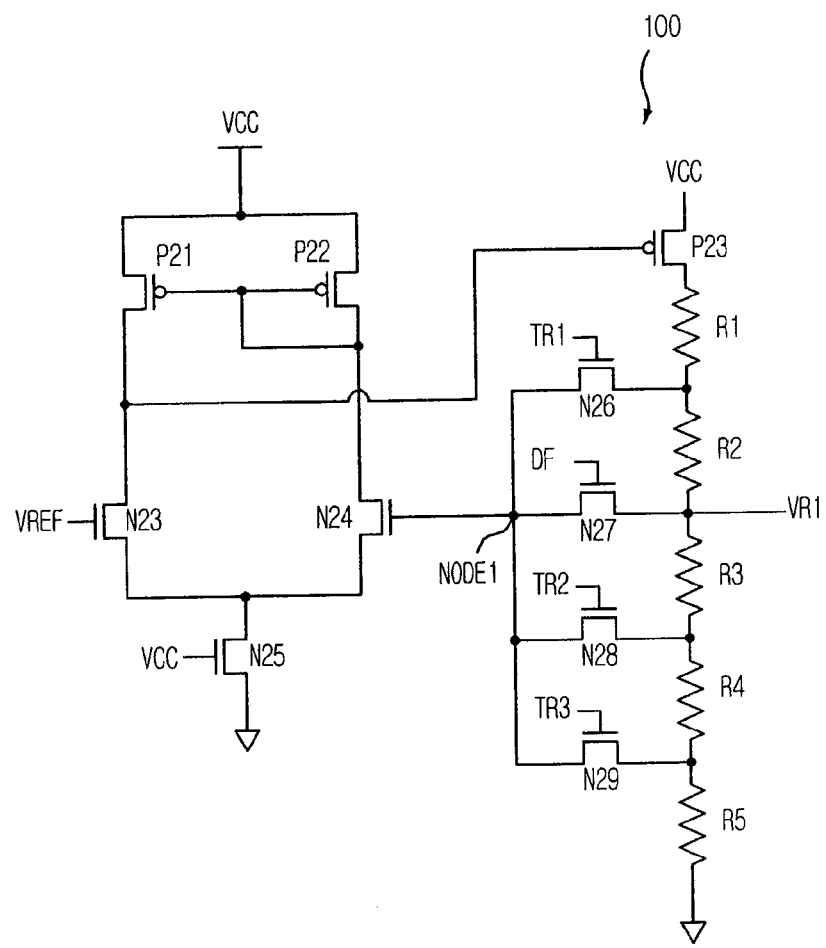
FIG. 16 is a schematic circuit diagram depicting a level shifter shown in FIG. 15.

FIG. 16 is a schematic circuit diagram depicting the level shifter 100 shown in FIG. 15.

As shown, the level shifter 100 is provided with three PMOS transistors P21 to P23, seven NMOS transistors N23 to N29, and five resistors R1 to R5. The level shifter 100 receives the reference voltage VREF through a gate of the twenty third NMOS transistor N23 and a voltage loaded on a first node NODE1. The voltage loaded on the first node NODE1 is inputted through a gate of the twenty fourth NMOS transistor N24. Herein, the twenty third and the twenty fourth NMOS transistors N23 and N24 form a current mirror differential amplifier together with a twenty first and a twenty second PMOS transistors P21 and P22.

After receiving the reference voltage VREF and the voltage loaded on the first node NODE1, the level shifter 100 compares the reference voltage VREF level with the voltage loaded on the first node NODE1 to thereby equalize the level of the first node NODE1 with the reference voltage VREF level.

The twenty sixth to twenty ninth NMOS transistors N26 to N29 perform a switching operation. Normally, the twenty seventh NMOS transistor N27 is turned on in response to a default signal DF to thereby output the shifted reference voltage VR1 of the reference voltage VREF level. On the contrary, when a different level of the reference voltage is required, i.e., when the shifted reference voltage VR1 is different from the reference voltage VREF, one of the NMOS transistors N26, N28, and N29 is turned on. That is, the default signal DF is inactivated; and one of trimming signals TR1 to TR3 is activated to activated corresponding NMOS transistor.

In order to inactivate the default signal DF and to activate the trimming signals TR1 to TR3, a test mode code can be inputted or a fuse cutting can be performed. The shifted reference voltage generated through the above procedure is outputted to the VPP level detector 110.

Figure 17:
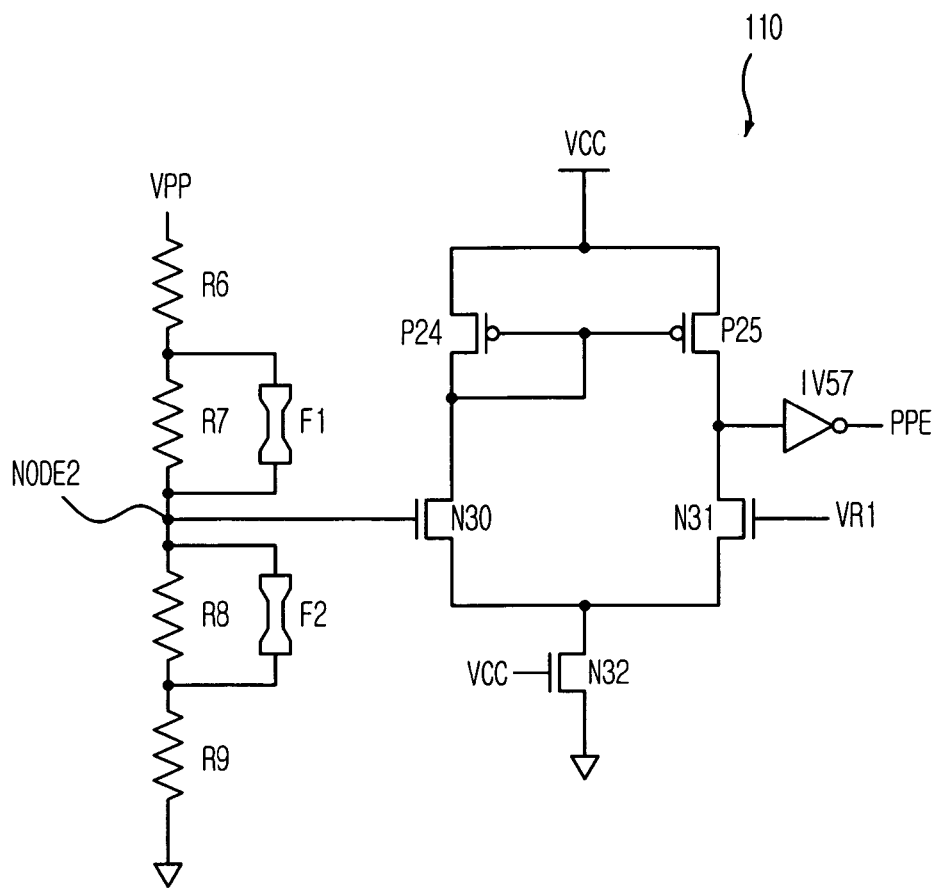
FIG. 17 is a schematic circuit diagram depicting a VPP level detector shown in FIG. 15.

FIG. 17 is a schematic circuit diagram depicting the VPP level detector 110 shown in FIG. 15.

As shown, the VPP level detector 110 is provided with four resistors R6 to R9, a first and a second fuses F1 and F2, two PMOS transistors P24 and P25, three NMOS transistor N30 to N32, and an inverter INV57.

The VPP level detector 110 receives the pumping voltage VPP and compares the shifted reference voltage VR1 with a voltage loaded in a second node NODE2 to thereby output the pumping enable signal PPE.

That is, when the pumping voltage VPP level is lower than a target voltage level, the voltage loaded at the second node NODE2 is lower than the shifted reference voltage VR1; and, as a result, the pumping enable signal PPE becomes a logic level 'H'. On the contrary, when the pumping voltage VPP level is the same with or higher than the target voltage level, the voltage loaded on the second node NODE2 is higher than the shifted reference voltage VR1; and, therefore, the pumping enable signal becomes a logic level 'L'.

When it is required to change the pumping voltage VPP level, one of the fuses F1 and F2 is cut to thereby change a resistance ratio of a resistance between the pumping voltage VPP and the second node NODE2 and a resistance between the second node NODE2 and the ground voltage VSS. The VPP level detector 110 determines a performance quality of the pumping voltage generator. In other words, the conventional pumping voltage generator operates stably and consumes less power according to the performance of the VPP level detector 110.

Figure 18:
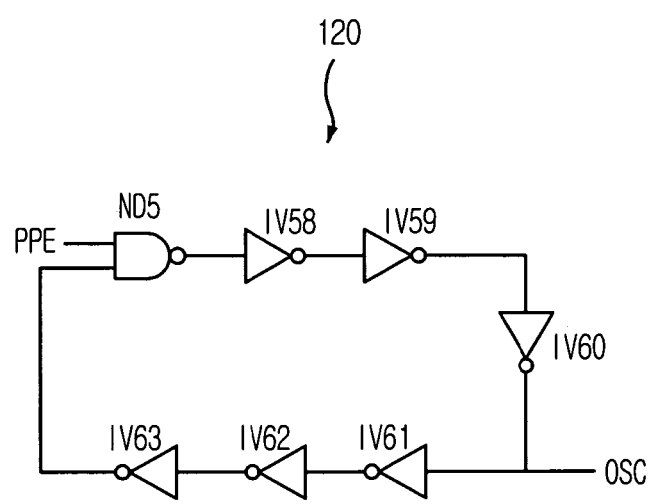
FIG. 18 is a schematic circuit diagram showing a ring oscillator shown in FIG. 15.

FIG. 18 is a schematic circuit diagram showing the ring oscillator 120 shown in FIG. 15.

The ring oscillator 120 includes a NAND gate ND5 and six inverters IV58 to IV63. The ring oscillator 120 is enabled when the pumping enable signal PPE is the logic level 'H' to thereby generate the oscillation signal OSC.

Figure 19A:
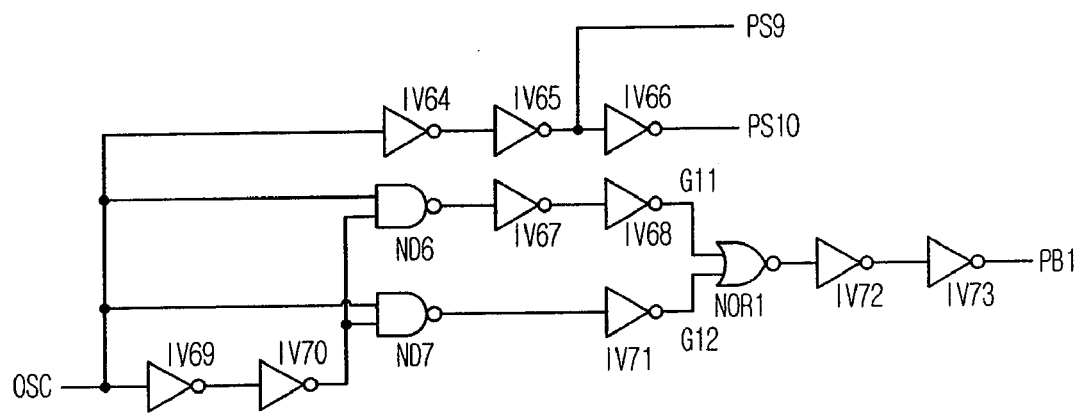
FIG. 19A is a schematic circuit diagram describing a pump control logic shown in FIG. 15.
Figure 19B:
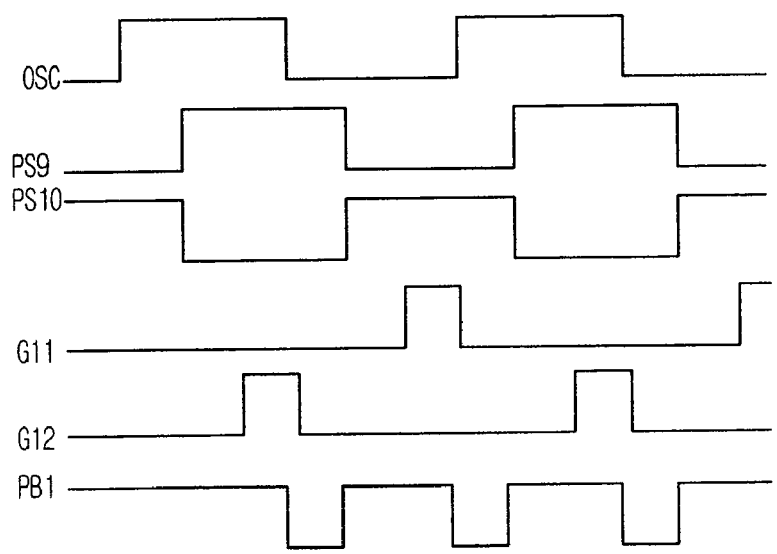
FIG. 19B is a waveform demonstrating an operation thereof.

FIG. 19A is a schematic circuit diagram describing the pump control logic 130 shown in FIG. 15, and FIG. 19B is a waveform demonstrating an operation thereof.

As shown in FIG. 19A, the pump control logic 130 is provided with ten inverters IV64 to IV73, two NAND gates ND6 and ND7, and a NOR gate NOR1. Herein, the NOR gate NOR1 receives the eleventh and the twelfth precharge control signals G11 and G12. The seventy second and seventy third inverters IV72 and IV73 delay an output of the NOR gate NOR1 to thereby generate the first precharge signal PB1. As a result, the pump control logic 130 generates the pumping control signals PS9, PS10, G11, and G12 and the first precharge signal PB1 shown in FIG. 19B in response to the oscillation signal OSC.

Figure 20A:
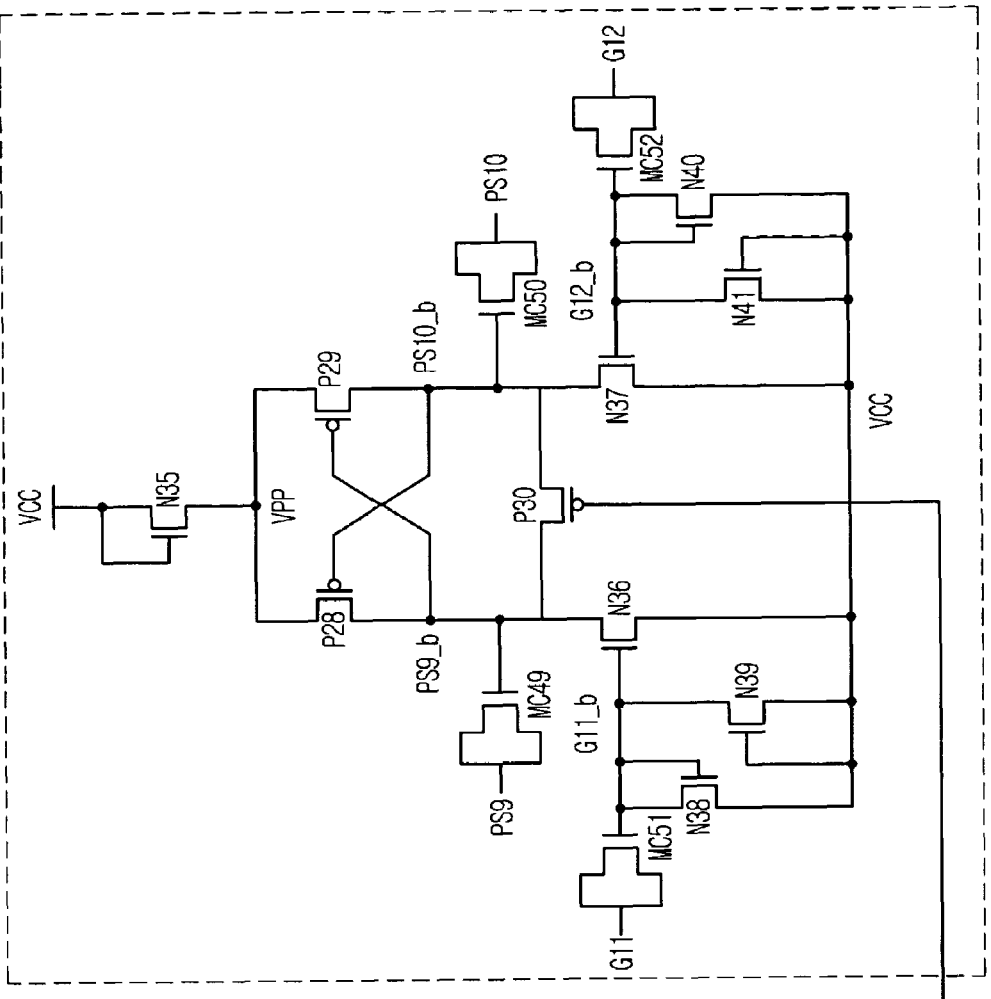
FIG. 20A is a schematic circuit diagram describing a doubler charge pump shown in FIG. 15.
Figure 20A:
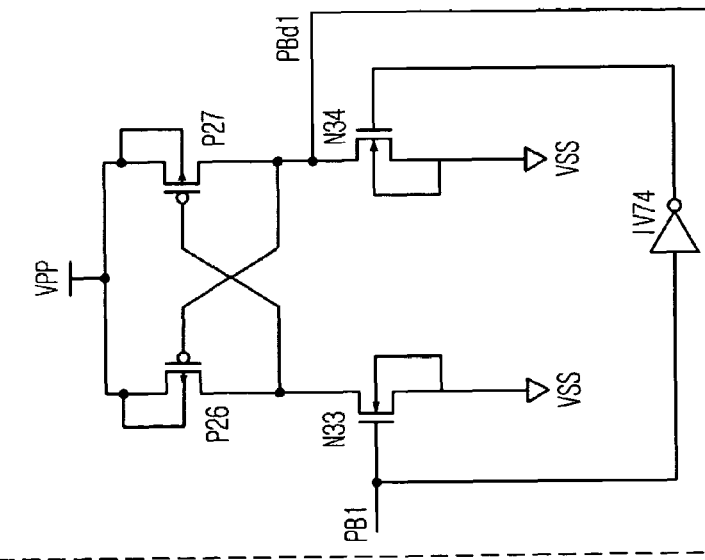
Figure 20B:
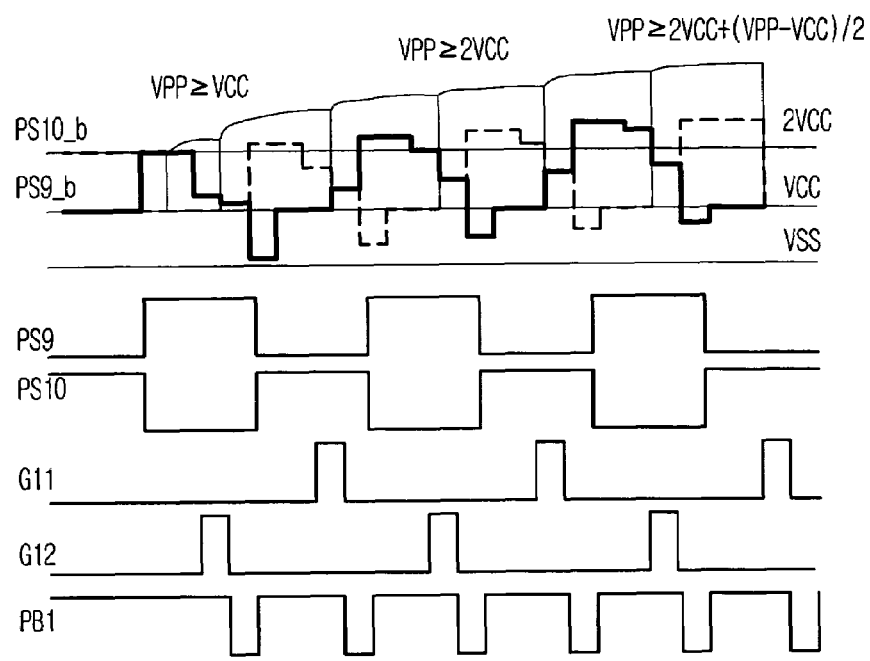
FIG. 20B is a waveform demonstrating an operation thereof.

FIG. 20A is a schematic circuit diagram describing the doubler charge pump 140 shown in FIG. 15, and FIG. 20B is a waveform demonstrating an operation thereof.

As shown, the doubler charge pump 140 includes a precharge controller 141 and a charge pump 142. The precharge controller 141 is provided with two PMOS transistors P26 and P27, two NMOS transistors N33 and N34, and an inverter IV74. The charge pump 142 is provided with seven NMOS transistors N35 to N41, three PMOS transistors P28 to P30, and four MOS capacitors MC49 to MC52.

In the precharge controller 141, the PMOS transistors P26 and P27 are parallel connected each other and are coupled to the pumping voltage VPP. The thirty third NMOS transistor N33, connected between the twenty sixth PMOS transistor P26 and the ground voltage VSS, receives the first precharge signal PB1 outputted from the pump control logic 130 through a gate. The thirty fourth NMOS transistor N34, connected between the twenty seventh PMOS transistor P27 and the ground voltage VSS, receives an inverted first precharge signal PB1, inverted by the inverter IV74, through a gate thereof. Further, a precharge drive signal PBd1 is outputted through a common node of the twenty seventh PMOS transistor P27 and the thirty fourth NMOS transistor N34.

Herein, the first precharge signal PB1 is inputted to the doubler charge pump 140 to thereby increase the current efficiency by reusing the electric charge, remaining in the bootstrapping node.

Figure 1:
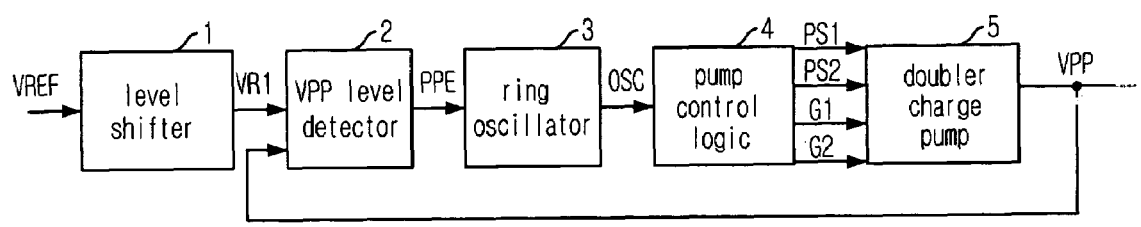
FIG. 1 is a block diagram describing a conventional pumping voltage generator.
Figure 2A:
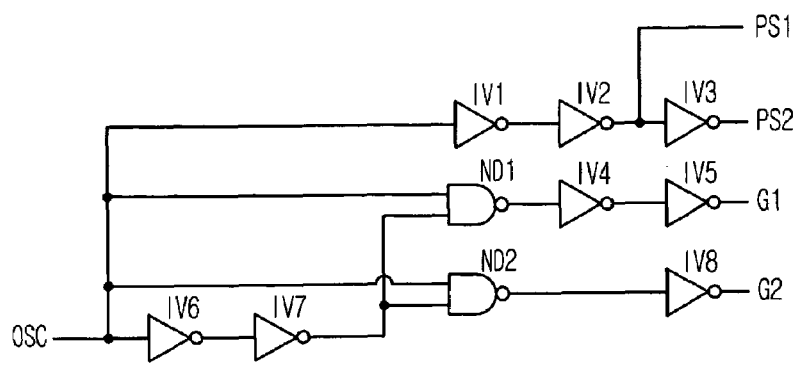
FIG. 2A is a schematic circuit diagram describing a pump control logic shown in FIG. 1.
Figure 3A:
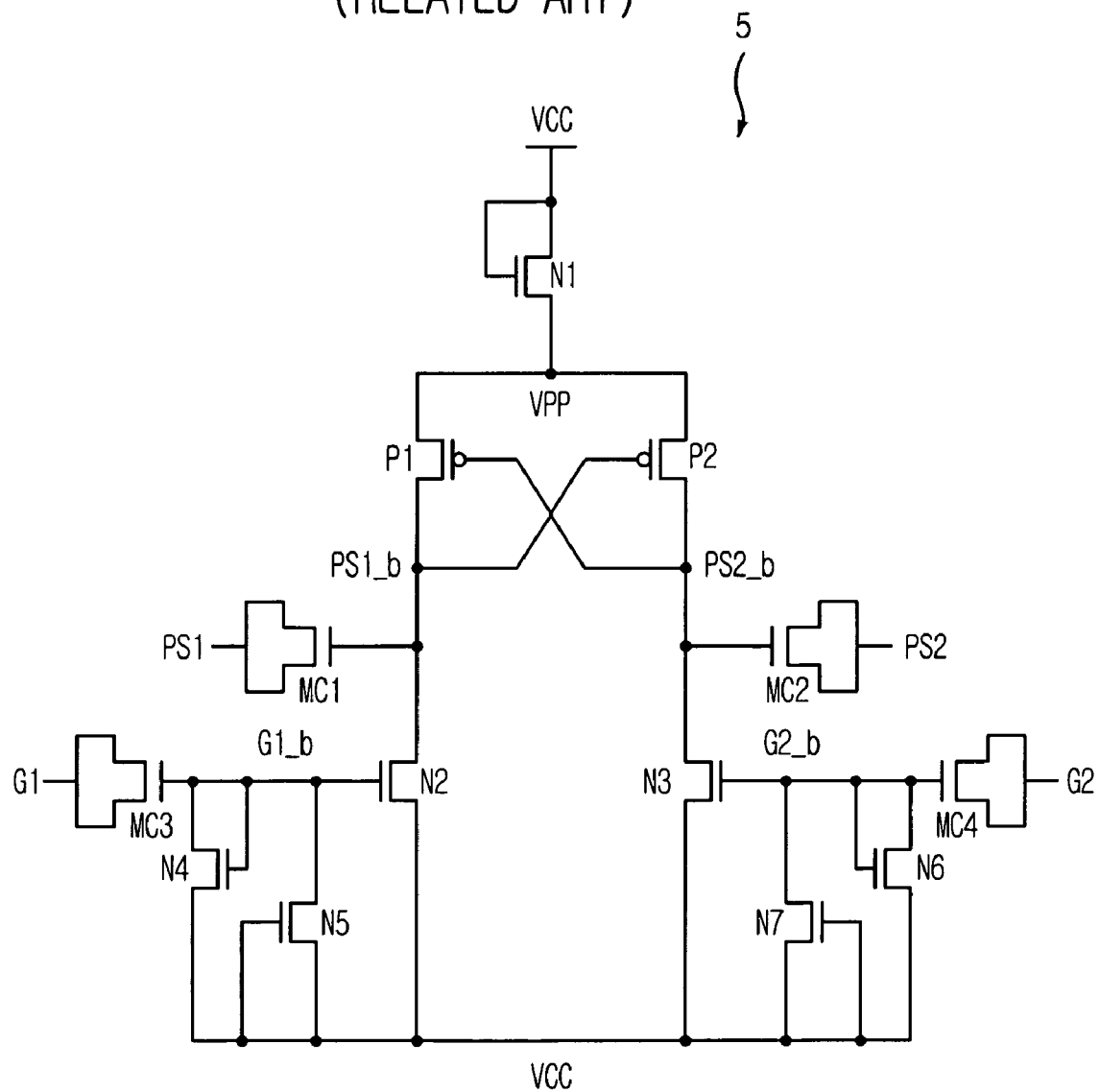
FIG. 3A is a schematic circuit diagram describing a doubler charge pump shown in FIG. 1.
Figure 4:
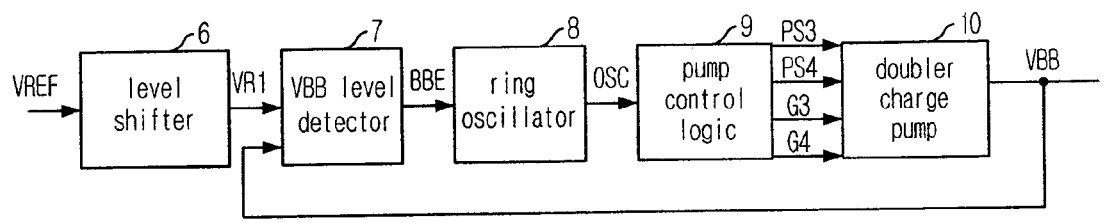
FIG. 4 is a block diagram describing a conventional back bias voltage generator.
Figure 5A:
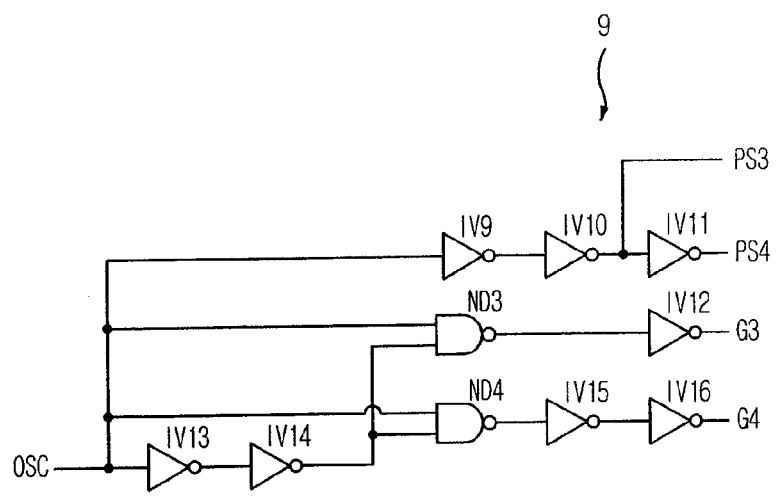
FIG. 5A is a schematic circuit diagram describing a pump control logic shown in FIG. 4.
Figure 5B:
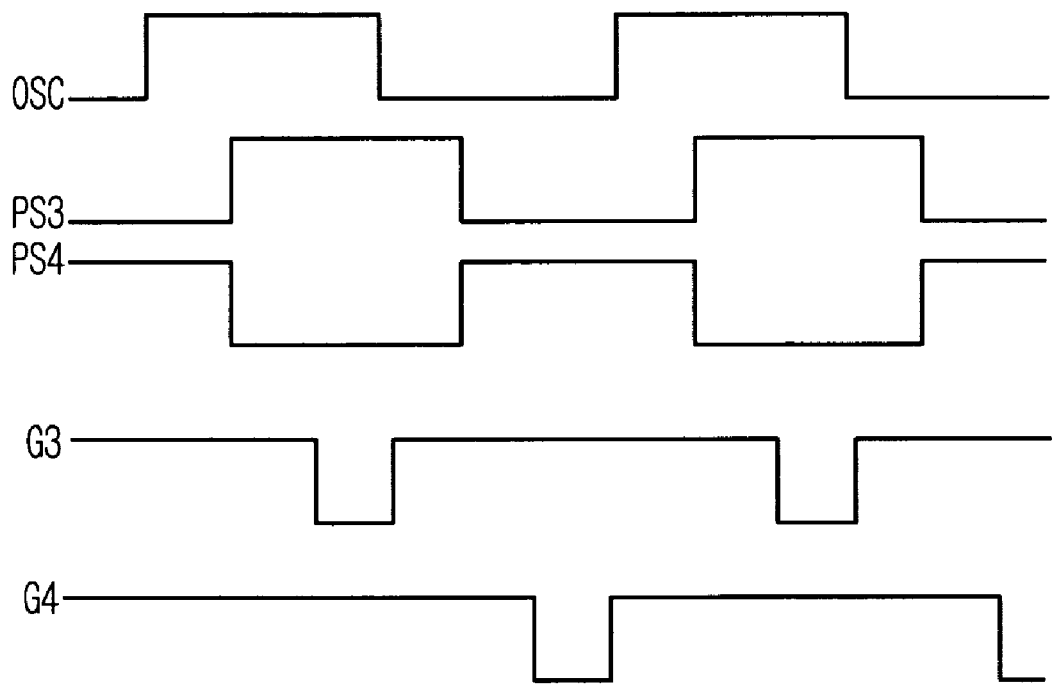
FIG. 5B is a waveform demonstrating an operation thereof.

Comparing the charge pump 142 with the conventional doubler charge pump 5 shown in FIG. 3A, the charge pump 142 further includes a precharge PMOS transistor P30 between a ninth and a tenth bootstrapping nodes PS9_*b* and PS10_*b*. The precharge PMOS transistor P30 receives the precharge drive signal PBd1 through a gate. When the first precharge signal PB1 is a logic level 'L', the precharge PMOS transistor P30 precharges the ninth and the tenth bootstrapping nodes PS9_*b* and PS10_*b*.

That is, the charge pump 142 firstly precharges the ninth and the tenth bootstrapping nodes PS9_*b* and PS10_*b* into the power supply voltage VCC level by using the eleventh and the twelfth precharge control signals G11 and G12. Then, as the first precharge signal PB1 becomes a logic level 'L', the electric charge remaining in the ninth and the tenth bootstrapping nodes PS9_*b* and PS10_*b* is not discharged but reused. Therefore, the bootstrapping nodes PS9_*b* and PS10_*b* are precharged with (VCC+(VPP−VCC)/2) level. Consequently, the current efficiency of the charge pump is improved to increase the pumping voltage VPP level.

Hereinafter, the operation of the doubler charge pump 140 shown in FIG. 20A is explained, referring to FIG. 20B.

First, when the ninth pumping control signal PS9 is changed from the ground voltage VSS level into the power supply voltage VCC level, the ninth bootstrapping node PS9_$b$ is bootstrapped. Then, the ninth bootstrapping node PS9_$b$ is charge-shared with the pumping voltage VPP terminal to adjust the tenth bootstrapping node PS10_$b$ to (VPP−VCC) level. After the thirty seventh NMOS transistor N37 is turned on, the tenth bootstrapping node PS10_$b$ is precharged with the power supply voltage VCC level.

Subsequently, when the precharge control signal is enabled into the logic level 'L', the ninth bootstrapping node PS9_$b$ of the pumping voltage VPP level is precharged by using the tenth bootstrapping node PS10_$b$ of the power supply voltage VCC level. Therefore, the ninth and the tenth bootstrapping nodes PS9_$b$ and PS10$b$ are charged with (VCC+(VPP−VCC)/2) level or (VPP−(VPP−VCC)/2) level.

According to the abovementioned method, a remained electric charge occurring when the ninth bootstrapping node PS9_$b$ is changed from the pumping voltage VPP level into the (VPP−VCC) level is provided to the tenth bootstrapping node PS10_$b$ instead of being wasted through the power supply voltage VCC terminal.

Therefore, the ninth bootstrapping node PS9_$b$ is charged with (VPP−VCC−(VPP−VCC)/2) which is lower than (VPP−VCC). Thereafter, when the thirty seventh NMOS transistor N37 is turned on, the ninth bootstrapping node PS9_$b$ is precharged with the power supply voltage VCC level. Then, when the tenth pumping control signal PS10 is changed from the ground voltage VSS to power supply voltage VCC level, the tenth bootstrapping node PS10_$b$ can be bootstrapped to (2VCC+(VPP−VCC)/2) level because of the electric charge provided from the ninth bootstrapping node PS9_$b$ to the tenth bootstrapping node PS11_$b$.

Referring to FIG. 20B, the ninth and the tenth bootstrapping nodes PS9_$b$ and PS10_$b$ can be bootstrapped up to (2VCC+(VPP−VCC)/2) level and can be precharged to (VCC+(VPP−VCC)/2) level or (VPP−(VPP−VCC)/2) level. As a result, the pumping voltage VPP can be increased up to (2VCC+(VPP−VCC)/2) level. Herein, the current efficiency is derived by dividing the electric charge of the pumping voltage VPP by the electric charge of the power supply voltage VCC. Further, a voltage efficiency can be obtained by dividing a target level of the pumping voltage VPP by a maximum level of the pumping voltage VPP.

Therefore, the current efficiency of the doubler charge pump 140 shown in FIG. 20A is determined by an equation ((((2VCC−VPP)+(VPP−VCC)/2×C)/2VCC×C)×100). Herein, C denotes a capacitance of the ninth and the tenth bootstrapping nodes PS9_$b$ and PS10_$b$. Further, the theoretical maximum level of the pumping value VPP is (2VCC+(VPP−VCC)/2). For example, when the power supply voltage VCC is about 2.5V and the target level of the pumping voltage VPP is about 3.5V, the current efficiency becomes about 40%; and the maximum level of the pumping voltage VPP is about 5.5V.

Figure 21:
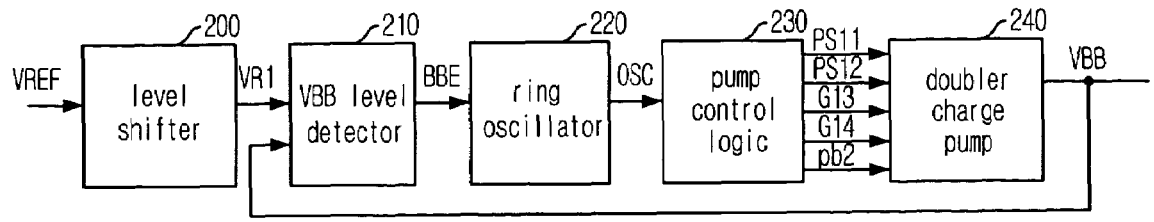
FIG. 21 is a block diagram describing a back bias voltage VBB generator in accordance with a preferred embodiment of the present invention

FIG. 21 is a block diagram describing a back bias voltage VBB generator in accordance with a preferred embodiment of the present invention.

As shown, the back bias voltage VBB generator includes a level shifter 200, a VBB level detector 210, a ring oscillator 220, a pump control logic 230, and a doubler charge pump 240.

The level shifter 200 outputs a shifted reference voltage VR1 by shifting a level of a reference voltage VREF. The VBB level detector 210 detects a level of the back bias voltage VBB in response to the shifted reference voltage VR1 to thereby output a back bias enable signal BBE. The ring oscillator 220 generates an oscillation signal OSC in response to the back bias enable signal BBE. The pump control logic 230 generates pumping control signals PS11, PS12, G13, and G14 and a second precharge signal PB2 in response to the oscillation signal OSC. The doubler charge pump 240 outputs the back bias voltage VBB in response to the pumping control signals PS11, PS12, G13, and G14 and the second precharge signal PB2 to the VBB level detector 210.

Figure 22:
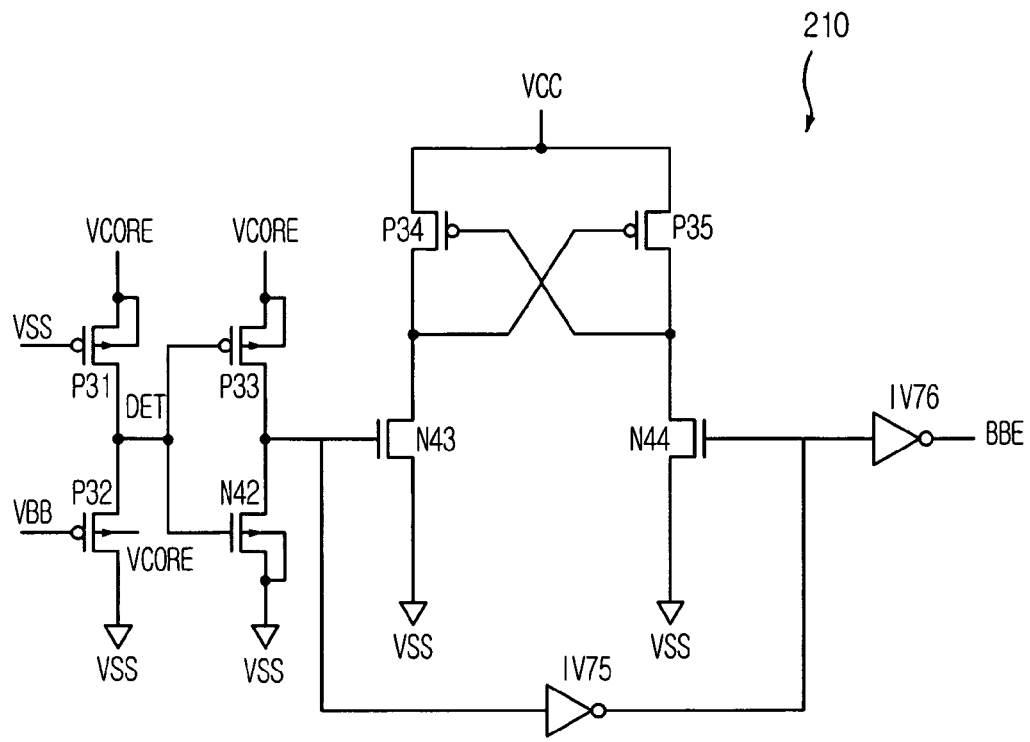
FIG. 22 is a schematic circuit diagram depicting a VBB level detector shown in FIG. 21.

FIG. 22 is a schematic circuit diagram depicting the VBB level detector 210 shown in FIG. 21.

As shown, the VBB level detector 210 includes five PMOS transistors P31 to P35, three NMOS transistors N42 to N44, and two inverters IV75 and IV76. Further, the VBB level detector 210 is provided in form of a PMOS resistance divider which is coupled between a core voltage VCORE and the ground voltage VSS. Herein, the core voltage VCORE is used inside of a DRAM core area.

The PMOS transistors P31 and P32 receive the ground voltage and the back bias voltage through gates, respectively. If an absolute value of the back bias voltage VBB is lower than a predetermined value, i.e., if a back bias voltage VBB level is closer to the ground voltage than a target level, a resistance of the thirty second PMOS transistor P32, receiving the back bias voltage VBB, is increased. Thus, a voltage level loaded on the detection node DET is also increased. Then, the back bias enable signal BBE having a logic level 'L' is outputted through the inverters IV75 and IV76.

Figure 23:
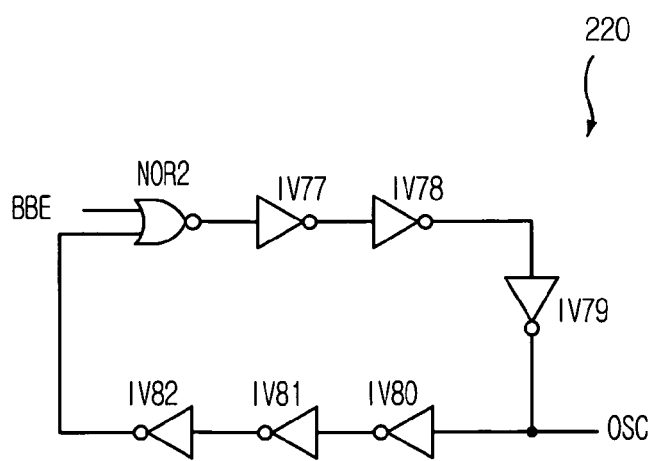
FIG. 23 is a schematic circuit diagram showing a ring oscillator shown in FIG. 21.

FIG. 23 is a schematic circuit diagram showing the ring oscillator 220 shown in FIG. 21.

The ring oscillator 220 includes a NOR gate NOR2 and six inverters IV77 to IV82. The ring oscillator 220 is enabled when the back bias enable signal BBE is the logic level 'L' to thereby generate the oscillation signal OSC.

Figure 24A:
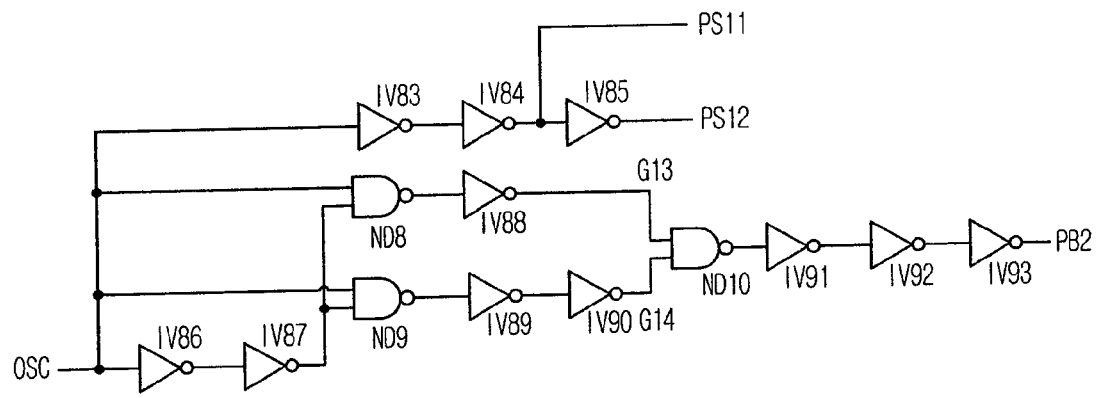
FIG. 24A is a schematic circuit diagram describing a pump control logic shown in FIG. 21.
Figure 24B:
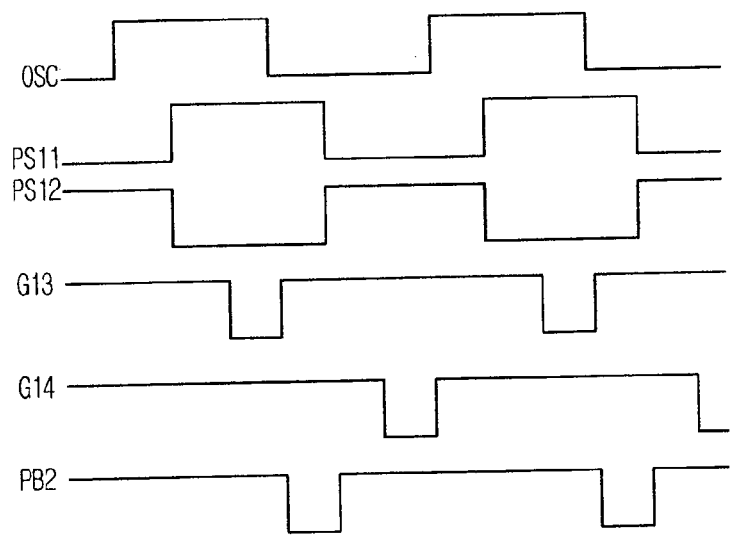
FIG. 24B is a waveform demonstrating an operation thereof.

FIG. 24A is a schematic circuit diagram describing the pump control logic 230 shown in FIG. 21, and FIG. 24B is a waveform demonstrating an operation thereof.

AS shown, the pump control logic 230 is provided with eleven inverters IV83 to IV93 and three NAND gates ND8 to ND10. Herein, the tenth NAND gate ND10 receives the thirteenth and the fourteenth precharge control signals G13 and G14. The inverters IV91 to IV93 delay an output of the tenth NAND gate ND10 to thereby generate the second precharge signal PB2. As a result, the pump control logic 230 generates the back bias control signals PS11, PS12, G13, and G14 and the second precharge signal PB2 shown in FIG. 24B in response to the oscillation signal OSC.

Figure 25A:
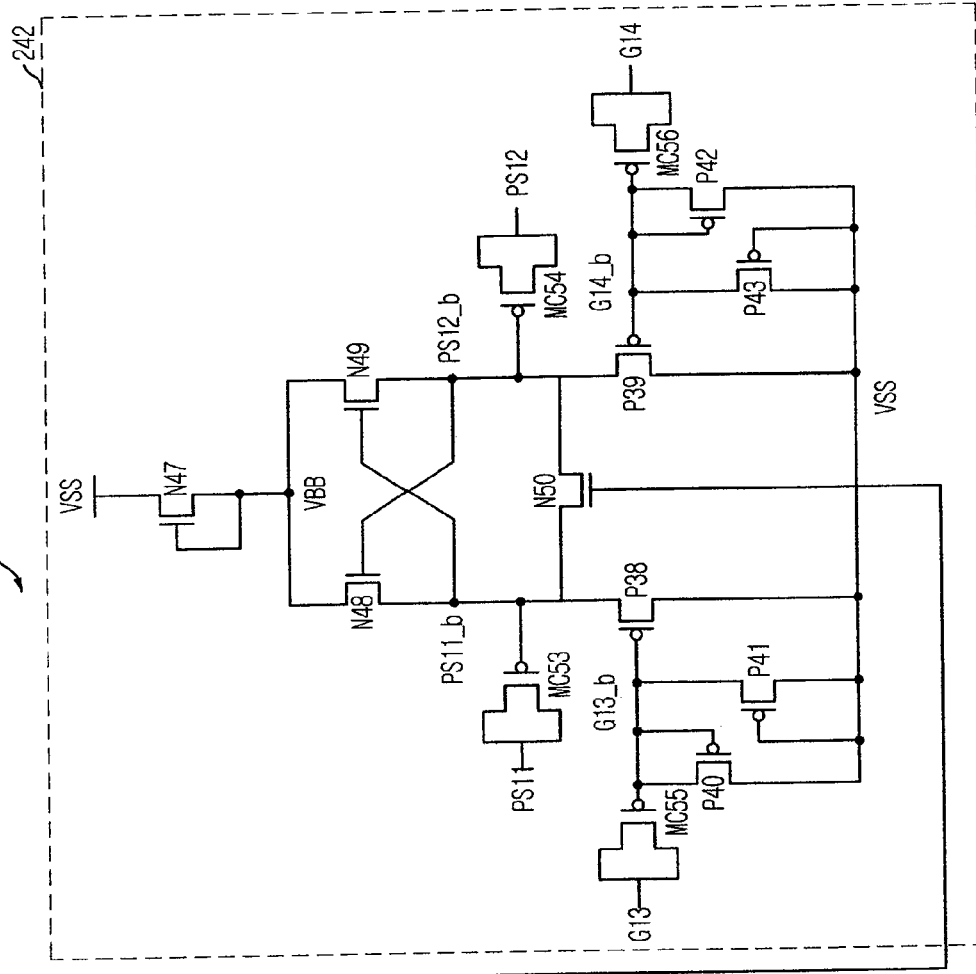
FIG. 25A is a schematic circuit diagram describing a doubler charge pump shown in FIG. 21.
Figure 25A:
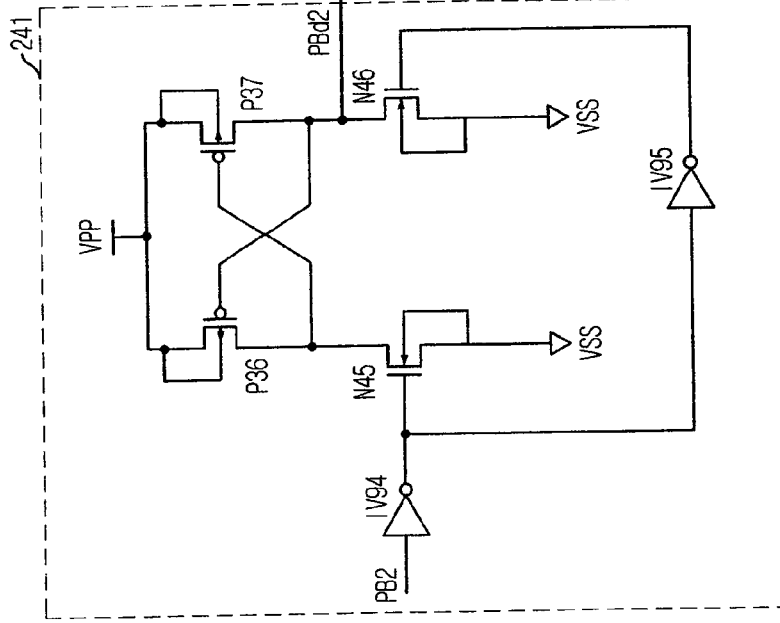
Figure 25B:
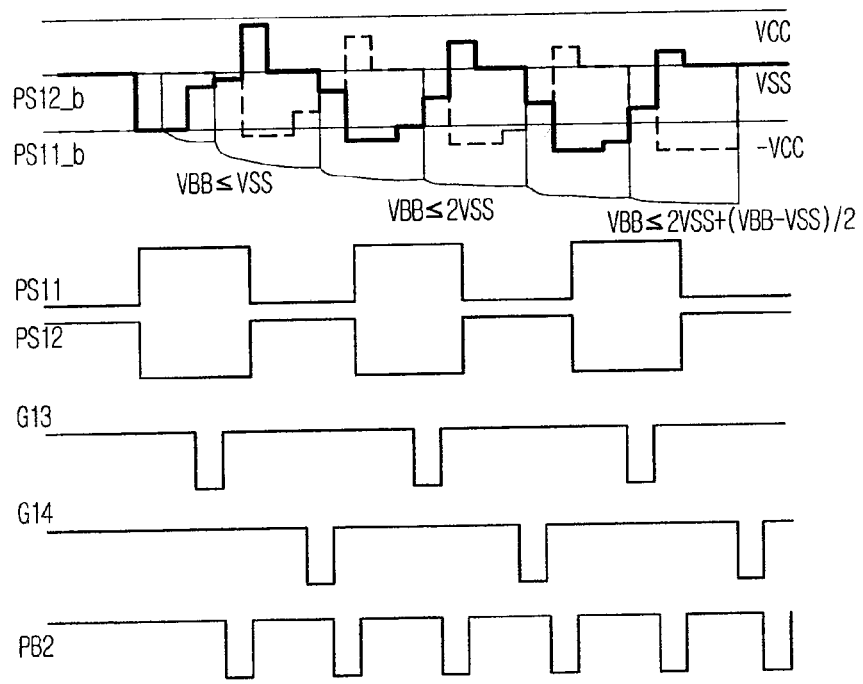
FIG. 25B is a waveform demonstrating an operation thereof.

FIG. 25A is a schematic circuit diagram describing the doubler charge pump 240 shown in FIG. 21, and FIG. 25B is a waveform demonstrating an operation thereof.

As shown, the doubler charge pump 240 includes a precharge controller 241 and a charge pump 242. The precharge controller 241 is provided with two PMOS transistors P36 and P37, two NMOS transistors N45 and N46, and two inverters IV94 and IV95. The charge pump 242 is provided with four NMOS transistors N47 to N50, six PMOS transistors P38 to P43, and four MOS capacitors MC53 to MC56.

In the precharge controller 241, the PMOS transistors P36 and P37, cross connected each other, are parallel connected to the pumping voltage VPP. The forty fifth NMOS transistor N45, connected between the thirty sixth PMOS transistor P36 and the ground voltage VSS, receives the second precharge signal PB2 outputted from the pump control logic 230 through a gate. The forty sixth NMOS transistor N46, connected between the thirty seventh PMOS transistor P37 and the ground voltage VSS, receives the delayed second precharge signal PB2, delayed by the inverters IV94 and IV95, through a gate. Further, a second precharge drive signal PBd2 is outputted through a common node of the thirty seventh PMOS transistor P37 and the forty sixth NMOS transistor N46.

Figure 6A:
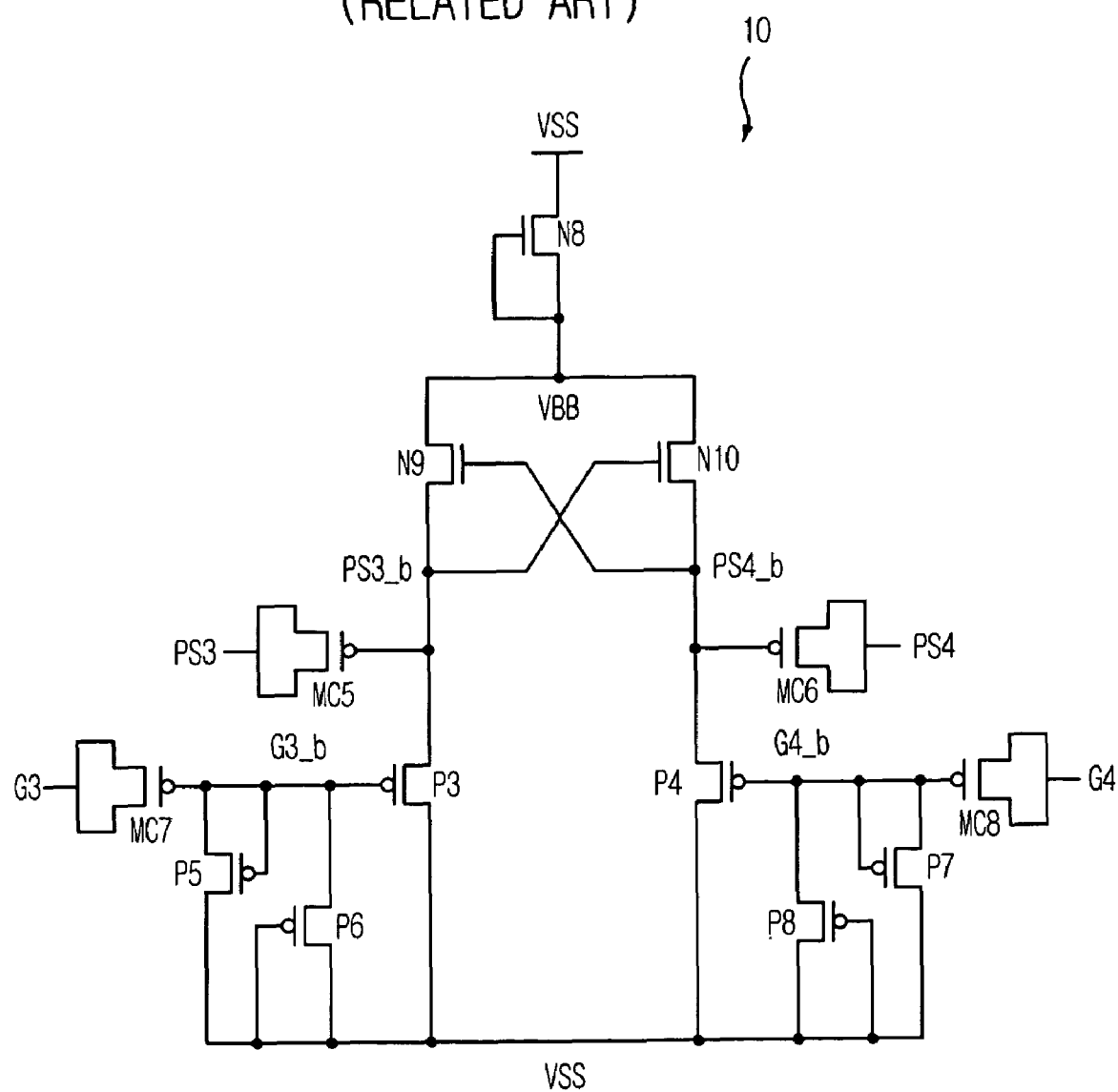
FIG. 6A is a schematic circuit diagram describing a doubler charge pump shown in FIG. 4.
Figure 6B:
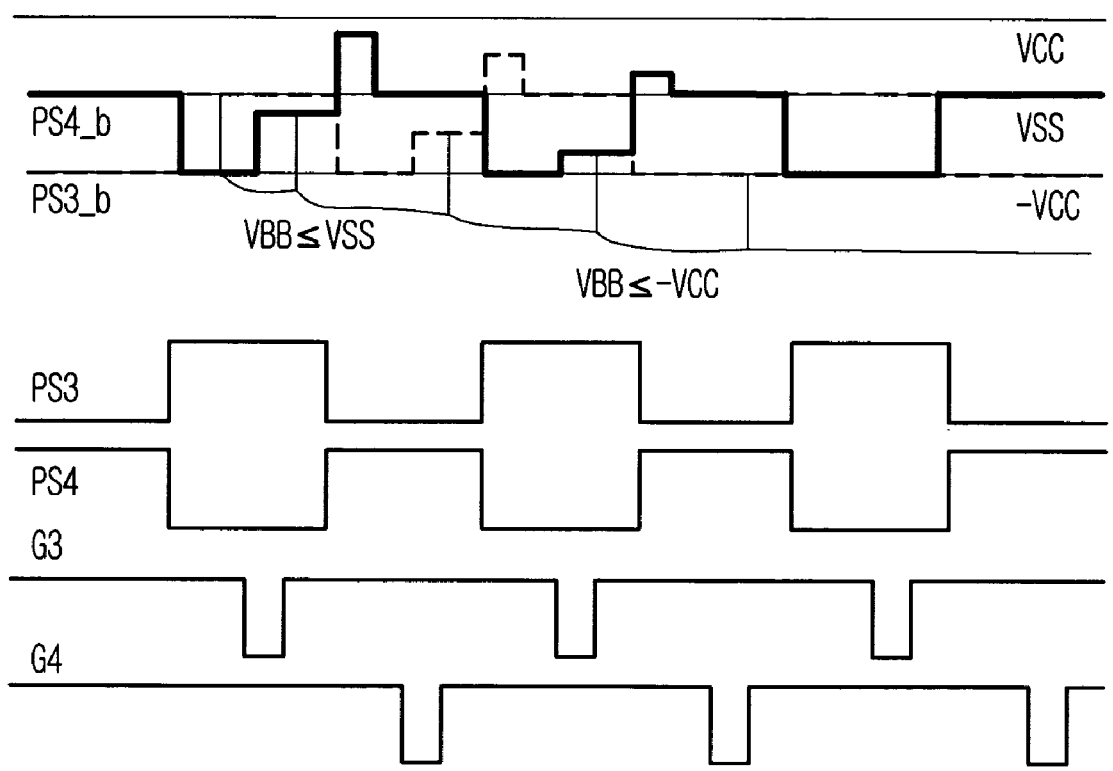
FIG. 6B is a waveform demonstrating an operation thereof.
Figure 7:
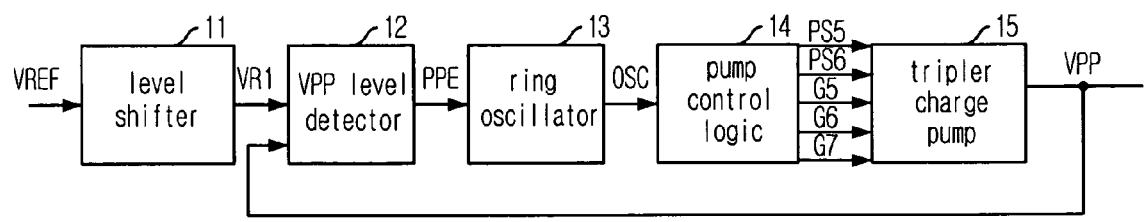
FIG. 7 is a block diagram describing a conventional tripler pumping voltage generator.
Figure 8A:
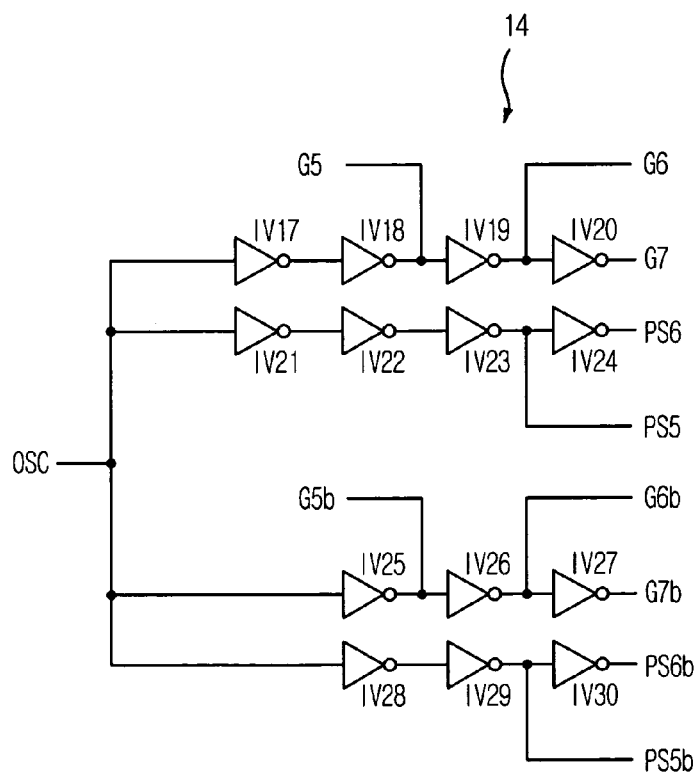
FIG. 8A is a schematic circuit diagram describing a pump control logic shown in FIG. 7.
Figure 8B:
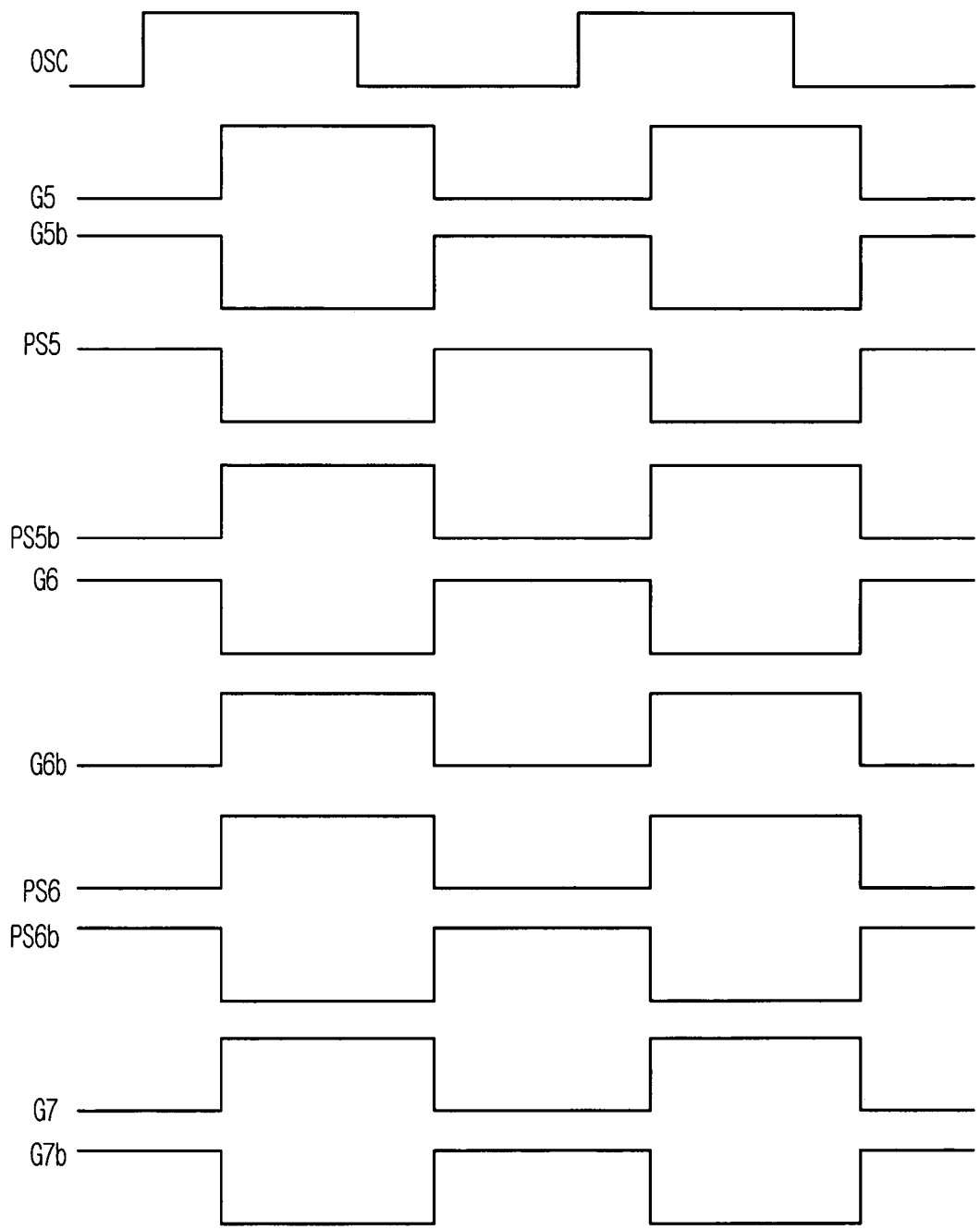
FIG. 8B is a waveform demonstrating an operation thereof.

Comparing the charge pump 242 with the conventional doubler charge pump 10 shown in FIG. 6A, the charge pump 242 further includes a precharge NMOS transistor N50 between a eleventh and a twelfth bootstrapping nodes PS11_b and PS12_b. The precharge NMOS transistor N50 receives the second precharge drive signal PBd2 through a gate. When the second precharge signal PB2 is a logic level 'L', the precharge NMOS transistor N50 precharges the eleventh and the twelfth bootstrapping nodes PS11_b and PS12_b.

That is, the charge pump 242 firstly precharges the eleventh and the twelfth bootstrapping nodes PS11_b and PS12_b to the ground voltage VSS level by using the thirteenth and the fourteenth precharge control signals G13 and G14. Then, as the second precharge signal PB2 becomes the logic level 'L', the electric charge remaining in the eleventh and the twelfth bootstrapping nodes PS11_b and PS12_b is not discharged but reused. Therefore, the precharge level of the eleventh and the twelfth bootstrapping nodes PS11_b and PS12_b is lowered. Thus, the current efficiency of the charge pump 242 is increased to decrease the back bias voltage VBB level.

Hereinafter, the operation of the doubler charge pump 240 shown in FIG. 23 is explained, referring to FIG. 25B.

First, after the eleventh and the twelfth bootstrapping nodes PS11_b and PS12_b are bootstrapped into the negative power supply voltage −VCC and the power supply voltage VCC level respectively, the eleventh bootstrapping node PS11_b and the back bias voltage VBB are charge shared with each other. Then, the thirty ninth PMOS transistor P39 is turned on to thereby precharge the twelfth bootstrapping node P12_b with the ground voltage VSS level.

Subsequently, when the second precharge signal PB2 is activated as the logic level 'L', the twelfth bootstrapping node PS12_b having the ground voltage VSS level is precharged by the eleventh bootstrapping node PS11_b having the back bias voltage VBB level. Therefore, the eleventh and the twelfth bootstrapping nodes PS11_b and PS12_b become (VSS−(VSS−VBB)/2) level.

According to the abovementioned method, the electric charge, occurred when the eleventh bootstrapping node PS11_b is changed from the back bias voltage VBB level into the (−(VSS−VBB)/2) level, is provided to the twelfth bootstrapping node PS12_b, instead of being wasted through the ground voltage VSS terminal.

Therefore, the twelfth bootstrapping node PS12_b becomes (−VCC+(VBB−VSS)/2) level or (−VCC−(VSS−VBB)/2) level. Herein, (−VCC+(VBB−VSS)/2) level or (−VCC−(VSS−VBB)/2) level are lower than the negative power supply voltage −VCC level. The eleventh bootstrapping node PS11_b is bootstrapped into ((VBB−VSS)/2+VCC) level. Thereafter, when the thirty eighth PMOS transistor P38 is turned on, the eleventh bootstrapping node PS11_b is precharged with the ground voltage VSS level.

Referring to FIG. 25B, the eleventh and the twelfth bootstrapping nodes PS11_b and PS12_b can be bootstrapped up to (−VCC+(VBB−VSS)/2) level and be precharged with (VSS−(VSS−VBB)/2) level or (VBB+(VSS−VBB)/2) level. As a result, the back bias voltage VBB can be increased up to (−VCC+(VBB−VSS)/2) level.

Therefore, the current efficiency of the doubler charge pump 240 shown in FIG. 25A is defined by the following equation $((((-VCC-VBB+(VBB-VSS))/2 \times C)/-VCC \times C) \times 100)$. Herein, C denotes a capacitance of the eleventh and the twelfth bootstrapping nodes PS11_b and PS12_b. Further, the theoretical maximum level of the back bias voltage VBB is (−VCC+(VBB−VSS)/2). For example, when the power supply voltage VCC is about 2.5V and the target level of the pumping voltage VPP is about −1V, the current efficiency becomes about 80%; and the maximum level of the pumping voltage VPP is about −3V. Herein, the current efficiency is generated by dividing the electric charge of the back bias voltage VBB by the electric charge of the ground voltage VSS.

Figure 26:
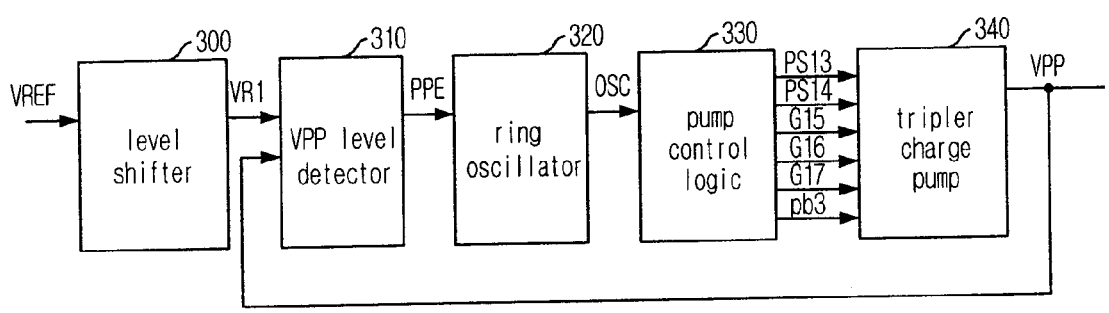
FIG. 26 is a block diagram describing a tripler pumping voltage generator in accordance with a preferred embodiment of the present invention.

FIG. 26 is a block diagram describing a tripler pumping voltage generator in accordance with a preferred embodiment of the present invention.

As shown, the tripler pumping voltage generator includes a level shifter 300, a VPP level detector 310, a ring oscillator 320, a pump control logic 330, and a tripler charge pump 340.

The level shifter 300 outputs a shifted reference voltage VR1 by shifting a level of a reference voltage VREF. The VPP level detector 310 detects a level of the pumping voltage VPP in response to the shifted reference voltage VR1 to thereby output a pumping enable signal PPE. The ring oscillator 320 generates an oscillation signal OSC in response to the pumping enable signal PPE. The pump control logic 330 generates pumping control signals PS13, PS14, G15, G16, and G17 and a third precharge signal PB3 in response to the oscillation signal OSC. The tripler charge pump 340 generates the pumping voltage VPP in response to the control signals PS13, PS14, G15, G16, and G17 and a third precharge signal PB3 to thereby transmit the pumping voltage VPP to the VPP level detector 310.

Herein, the level shifter 300, the VPP level detector 310, and the ring oscillator 320 is similar with those shown in FIG. 15.

Figure 27A:
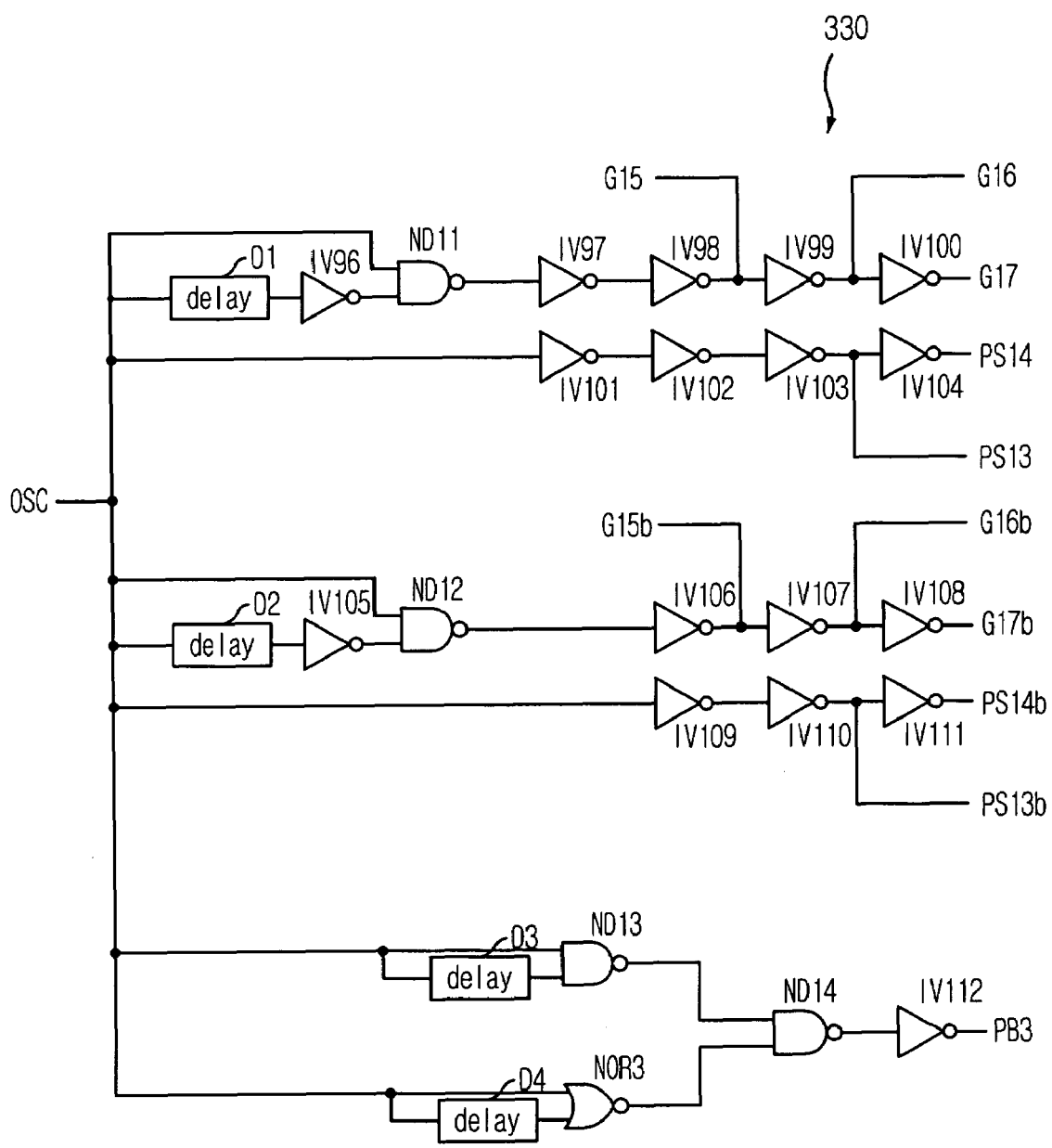
FIG. 27A is a schematic circuit diagram describing a pump control logic shown in FIG. 26.
Figure 27B:
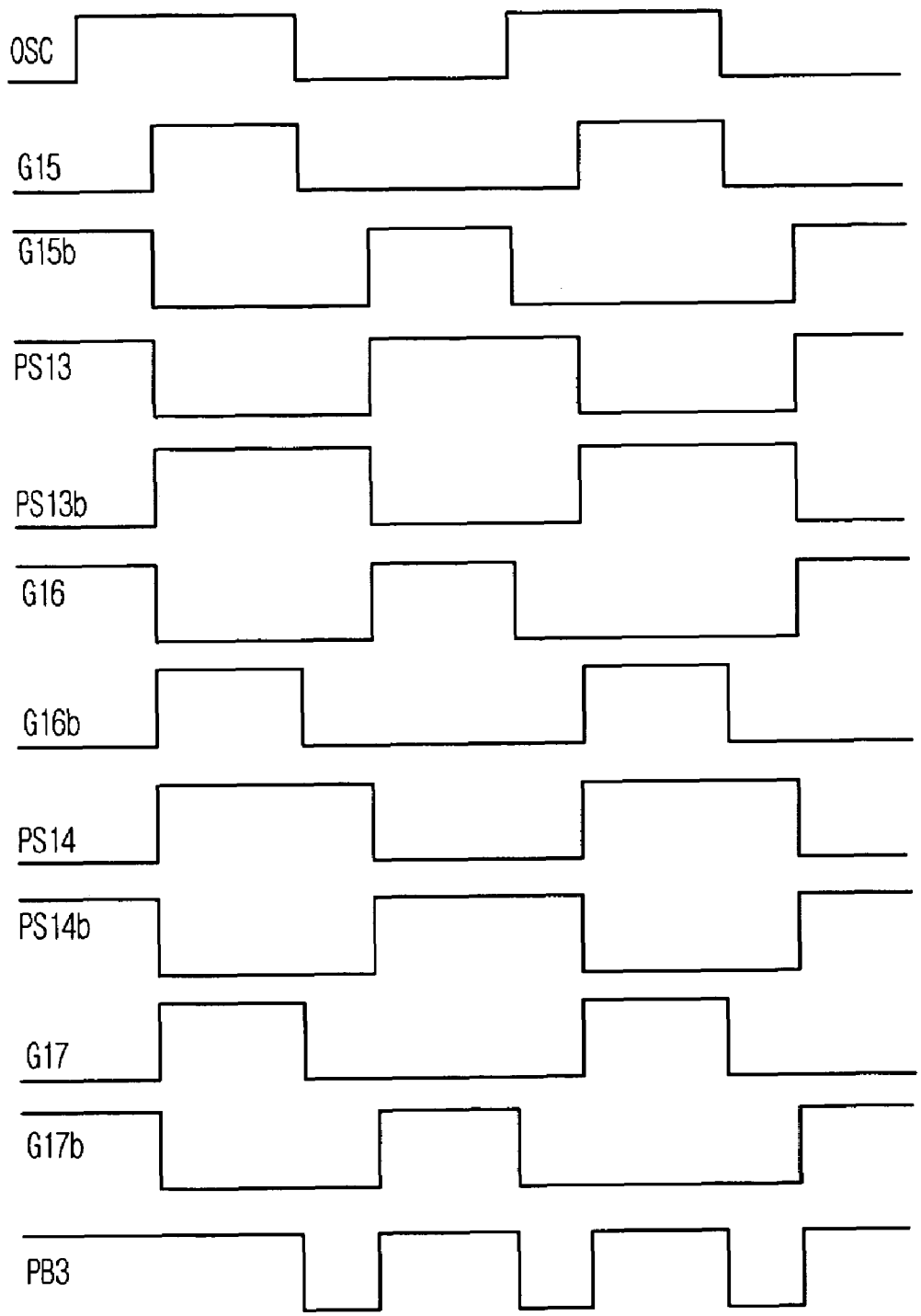
FIG. 27B is a waveform demonstrating an operation thereof.

FIG. 27A is a schematic circuit diagram describing the pump control logic 330 shown in FIG. 26, and FIG. 27B is a waveform demonstrating an operation thereof.

As shown in FIG. 27A, the pump control logic 330 is provided with seventeen inverters IV96 to IV112, four NAND gates ND11 and ND14, four delays D1 to D4, and a NOR gate NOR3.

The pump control logic 330 shown in FIG. 27A generates the pumping control signals PS13, PS14, G15, G16, and G17 and a third precharge signal PB3 shown in FIG. 27B in response to the oscillation signal OSC.

Herein, the pumping control signals PS13b, PS14b, G15b, G16b, and G17b are of opposite phase with those of the pumping control signals PS13, PS14, G15, G16, and G17.

Figure 28A:
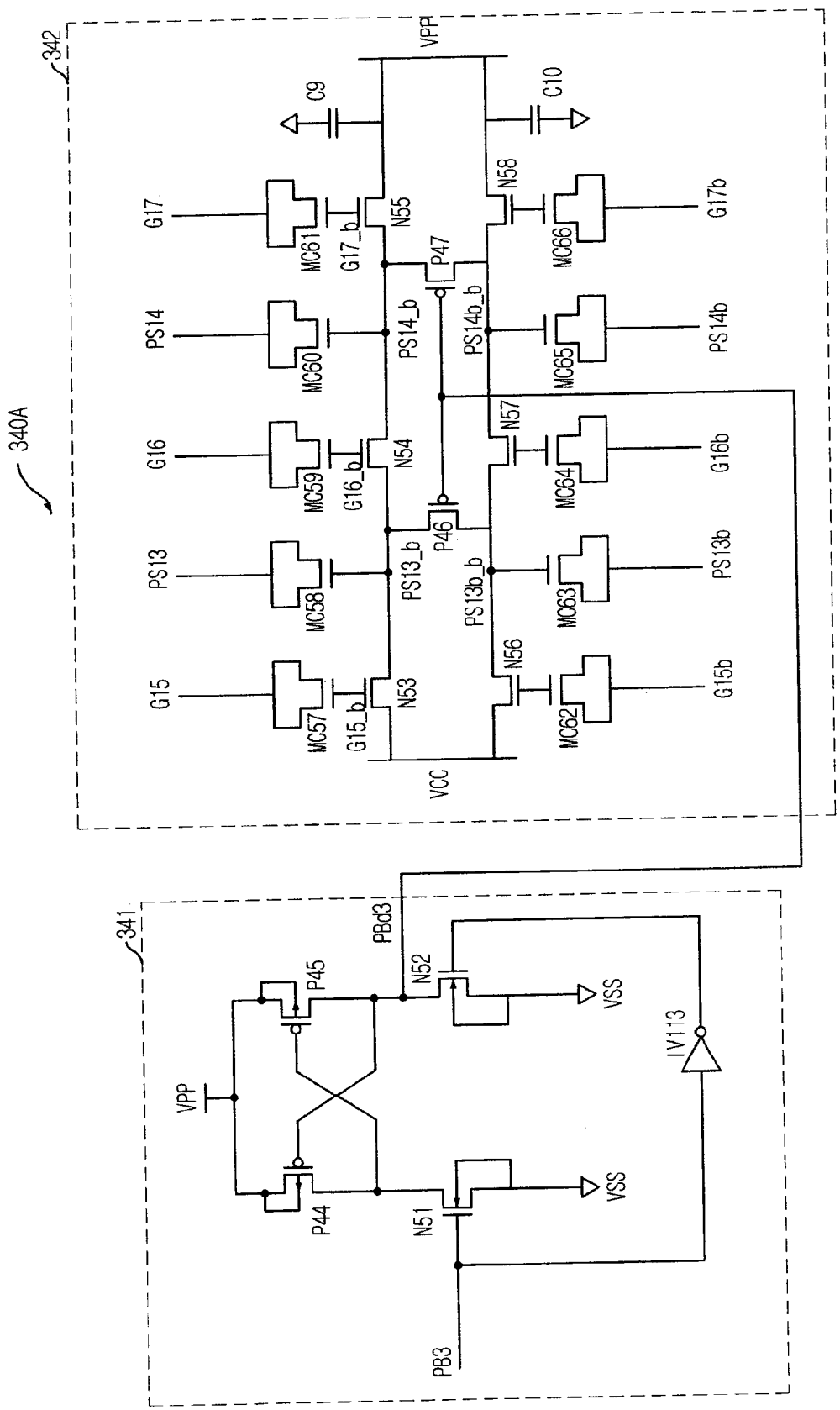
FIGS. 28A and 28B are schematic circuit diagrams of a tripler charge pump shown in FIG. 26.
Figure 28B:
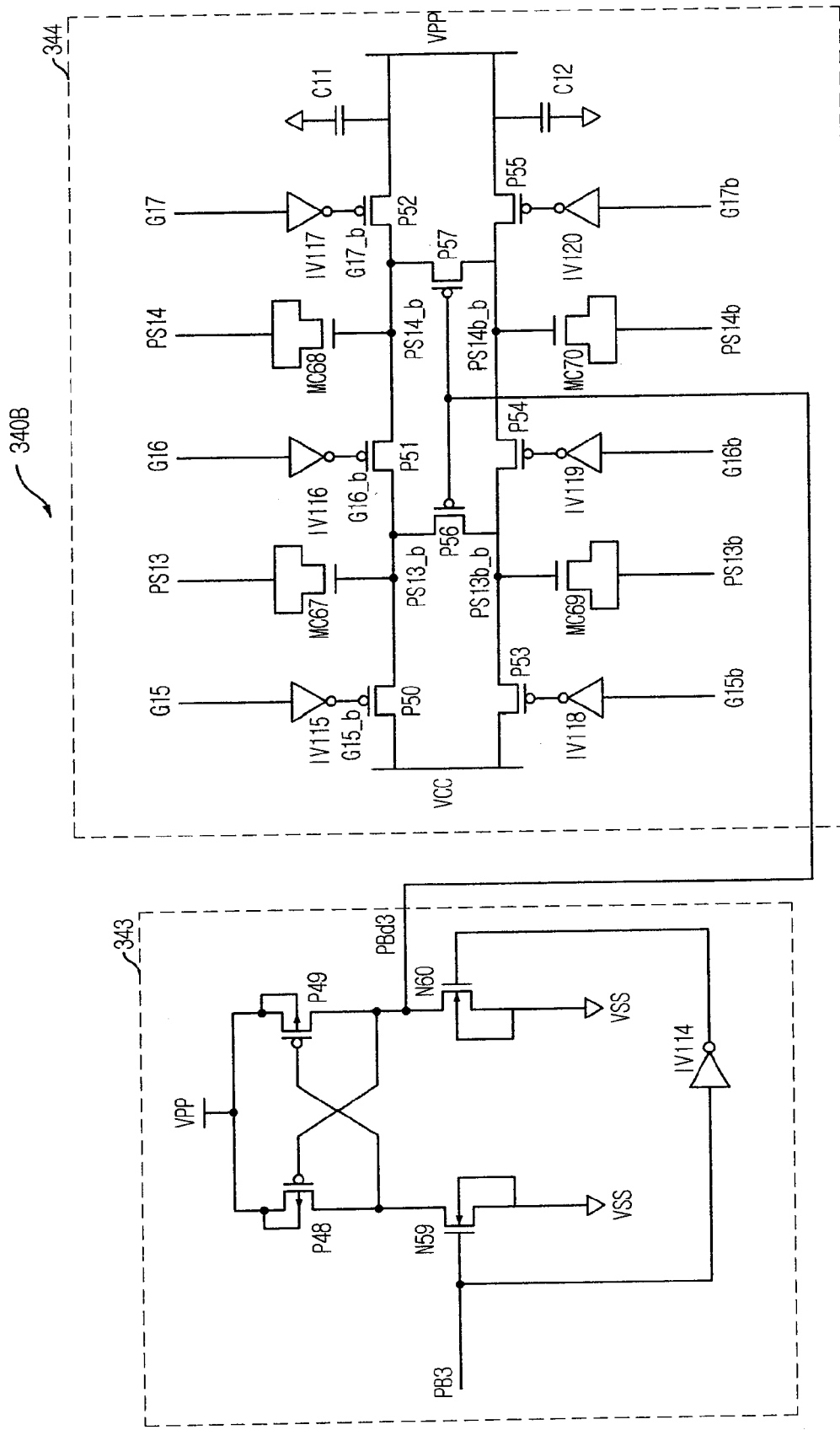

FIGS. 28A and 28B are schematic circuit diagrams of the tripler charge pump 340 shown in FIG. 26 in accordance with a first and a second embodiment.

First, as shown in FIG. 28A, the tripler charge pump 340A includes a first precharge controller 341 and a first charge pump 342. The first precharge controller 341 is provided with two PMOS transistors P44 and P45, two NMOS transistors N51 and N52, and an inverter IV113. The first charge pump 342 is provided with six NMOS transistors N53 to N58, ten MOS capacitors MC57 to MC66, two PMOS transistors P46 and P47, and two capacitors C9 and C10.

In the first precharge controller 341, the PMOS transistors P44 and P45 are parallel connected each other and are coupled to the pumping voltage VPP. The fifty first NMOS transistor N51, connected between the forty fourth PMOS transistor P44 and the ground voltage VSS, receives the third precharge signal PB3 outputted from the pump control logic 330 through a gate. The fifty second NMOS transistor N52, connected between the forty fifth PMOS transistor P45 and the ground voltage VSS, receives the inverted third precharge signal PB3, inverted by the inverter IV113, through a gate.

Further, a third precharge drive signal PBd3 is outputted through a common node of the forty fifth PMOS transistor P45 and the fifty second NMOS transistor N52.

Figure 9A:
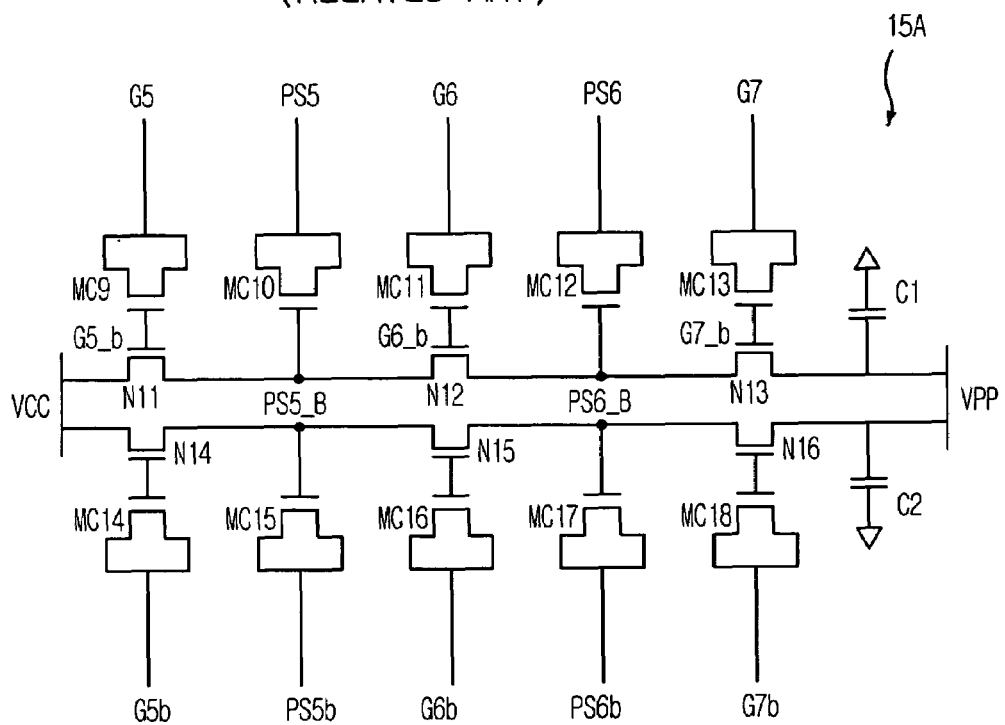
FIGS. 9A and 9B are schematic circuit diagrams of a tripler charge pump 15 shown in FIG. 7 in accordance with a first and a second embodiment.

As compared with the charge pump 15A shown in FIG. 9A, the first charge pump 342 further includes two PMOS transistors P46 and P47. The forty sixth PMOS transistor P46 is connected between the bootstrapping nodes PS13_b and PS13b_b; and the forty seventh PMOS transistor P47 is connected between the bootstrapping nodes PS14_b and PS14b_b.

As shown in FIG. 28B, the tripler charge pump 340B includes a second precharge controller 343 and a second charge pump 344. The second precharge controller 343 is provided with two PMOS transistors P48 and P49, two NMOS transistors N59 and N60, and an inverter IV114. The second charge pump 344 is provided with six PMOS transistors P50 to P55, four MOS capacitors MC67 to MC70, six inverters IV115 to IV120, and two capacitors C1 and C12.

In the second precharge controller 343, the PMOS transistors P48 and P49 are parallel connected each other and are coupled to the pumping voltage VPP. The fifty ninth NMOS transistor N59, connected between the forty eighth PMOS transistor P48 and the ground voltage VSS, receives the third precharge signal PB3 outputted from the pump control logic 330 through a gate. The sixtieth NMOS transistor N60, connected between the forty ninth PMOS transistor P49 and the ground voltage VSS, receives the inverted third precharge signal PB3, inverted by the inverter IV114, through a gate. Further, a third precharge drive signal PBd3 is outputted through a common node of the forty ninth PMOS transistor P49 and the sixtieth NMOS transistor N60.

Figure 9B:
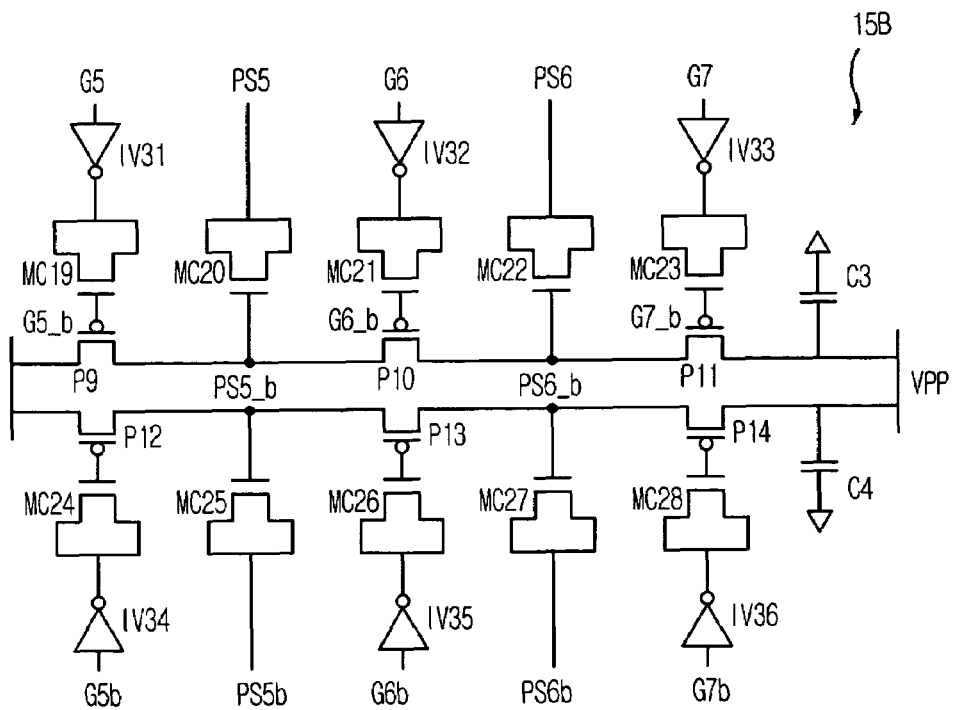
Figure 10A:
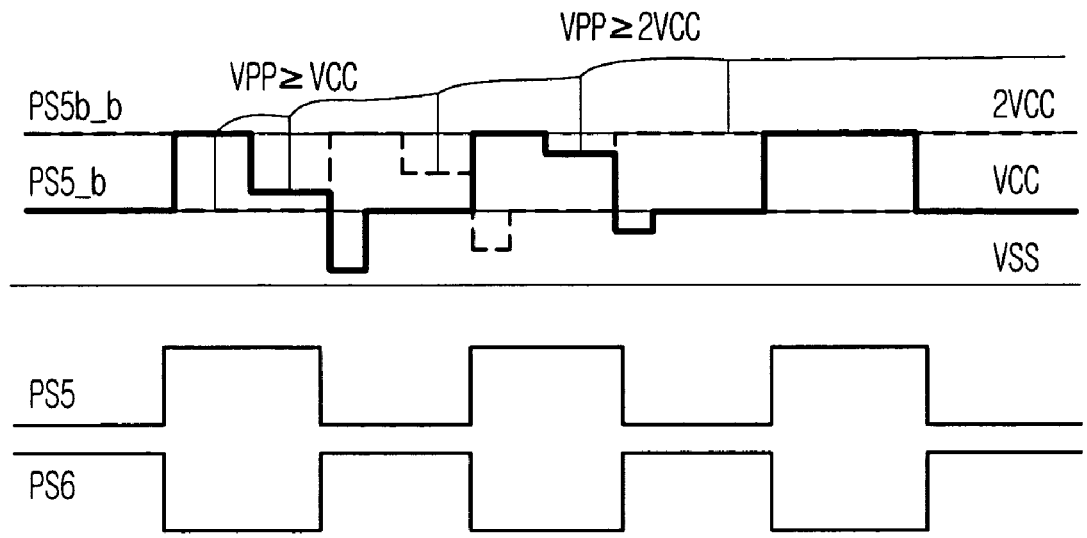
FIGS. 10A and 10B are waveforms demonstrating an operation of the tripler charge pump shown in FIG. 9A.
Figure 10B:
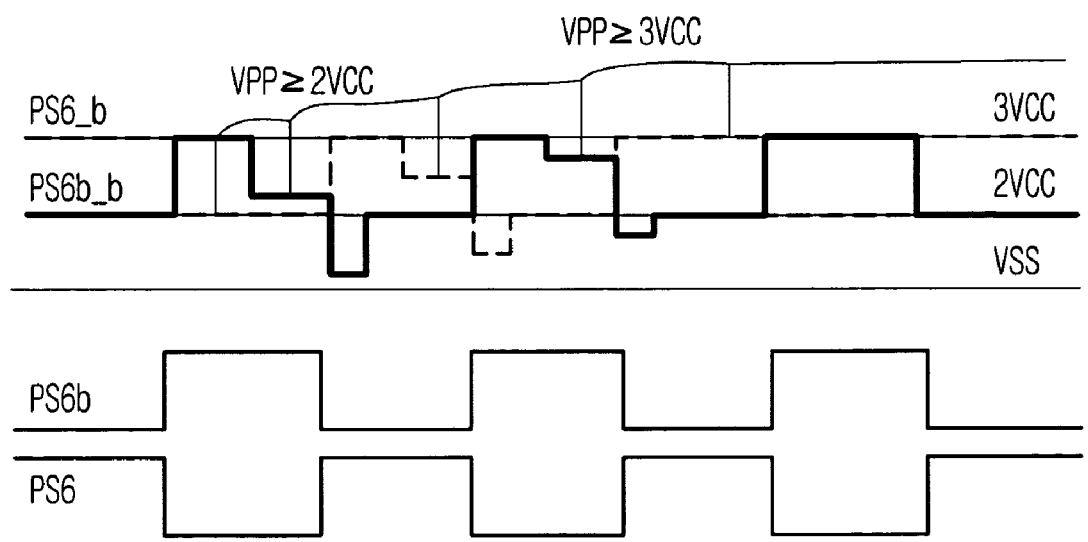
Figure 11:
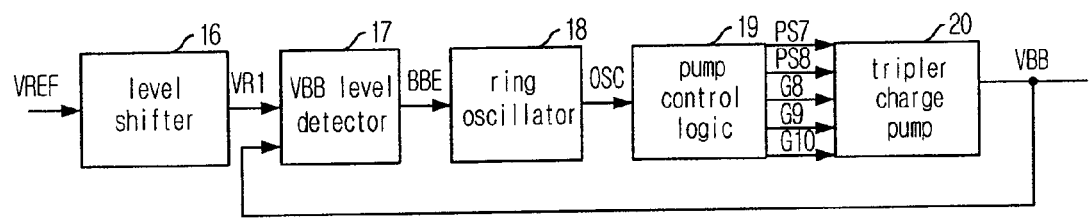
FIG. 11 is a block diagram describing a conventional tripler back bias voltage generator.
Figure 12A:
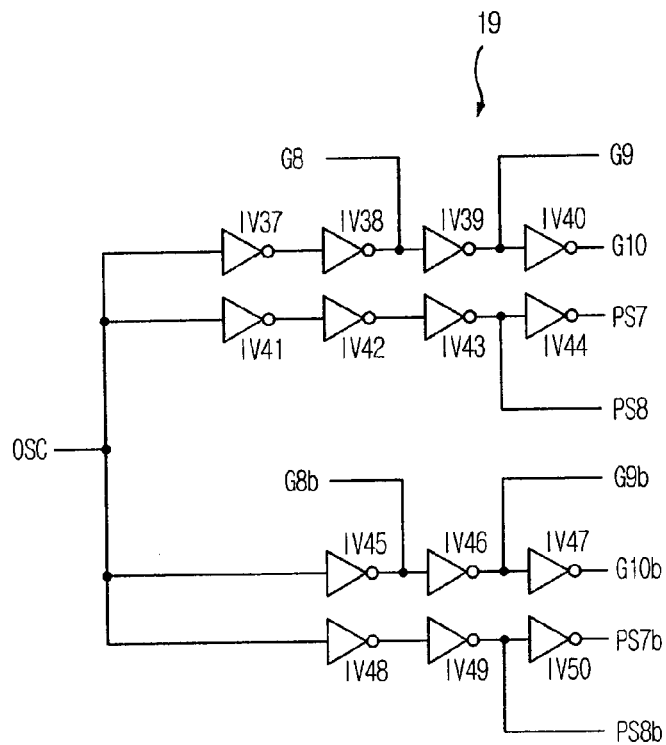
FIG. 12A is a schematic circuit diagram describing a pump control logic shown in FIG. 11.
Figure 12B:
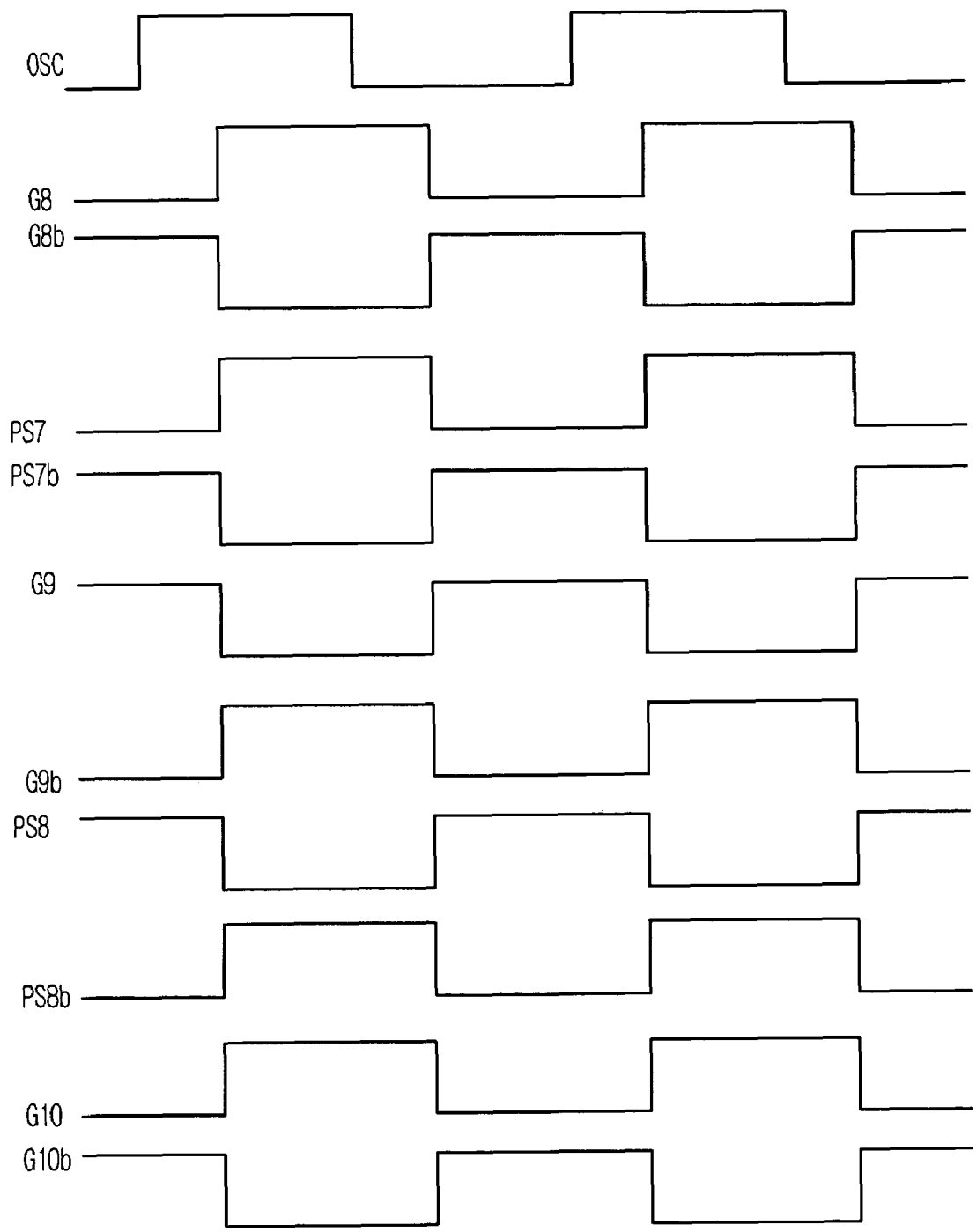
FIG. 12B is a waveform demonstrating an operation thereof.

Further, as compared with the charge pump 15B shown in FIG. 9B, the second charge pump 344 further includes two PMOS transistors P56 and P57. The fifty sixth PMOS transistor P56 is connected between the bootstrapping nodes PS13_b and PS13b_b; and the fifty seventh PMOS transistor P57 is connected between the bootstrapping nodes PS14_b and PS14b_b.

The first and the second precharge controllers 341 and 343 have the same structure; and the first and the second charge pumps 342 and 344 have almost the same structure. However, while the precharge control signals G15 to G17b inputted to the first charge pump 342 are inputted through the MOS capacitors MC57 to MC66 in order to control the NMOS transistors N53 to N58, the precharge control signals G15 to G17b are inputted through the inverters IV115 to IV120 in order to control the PMOS transistors P50 to P55 in the second charge pump 344. As a result, the first and the second charge pumps 342 and 344 perform the substantially same operation.

That is, the third precharge signal PB3 is inputted to the tripler charge pump 340 to increase the current efficiency by reusing the electric charge remained in the bootstrapping node.

Hereinafter, the operation of the charge pump 340A is explained.

First, after the thirteenth bootstrapping node PS13_b is precharged with the power supply voltage VCC level in response to the fifteenth precharge control signal G15, the third precharge signal PB3 is activated as a logic level 'L'. Then, the thirteenth pair of bootstrapping node PS13_b and PS13b_b are precharged. Therefore, the electric charge remained in the thirteenth bootstrapping node PS13_b is used to increase the voltage levels of the pair of bootstrapping node PS13_b and PS13b_b up to (VCC+(PS14b_b−VCC)/2) level and (VCC+(PS14_b−VCC)/2) level respectively.

Further, after precharged with the double power supply voltage 2VCC level in response to the sixteenth precharge control signal G16, the fourteenth bootstrapping node PS14_b is further precharged with the bootstrapping node PS14b_b in response to the third precharge signal PB3 having the logic level 'L'. Therefore, the electric charge remained in the fourteenth bootstrapping node PS14_b is used to increase each voltage level of the fourteenth pair of bootstrapping node PS14_b and PS14b_b into each of (2VCC+(PS14b_b−2VCC)/2) level and (2VCC+(PS14_b−2VCC)/2) level.

Herein, the voltage level loaded on the fourteenth pair of bootstrapping node PS14_b and PS14b_b is the pumping voltage VPP level. Therefore, the prechage voltage level of the fourteenth pair of bootstrapping node PS14_b and PS14b_b become (2VCC+(VPP−2VCC)/2) level; and, thus, the voltage level of the fourteenth pair of bootstrapping node PS14_b and PS14b_b can be increased into (3VCC+(VPP−2VCC)/2) level. As a result, the current efficiency between the fourteenth pair of bootstrapping node PS14_b and PS14b_b and the pumping voltage VPP becomes (3VCC−VPP+(VPP−2VCC)/2)/3VCC) level and, therefore, the pumping voltage VPP can be increased up to (3VCC+(VPP−2VCC)/2) level.

Figure 29A:
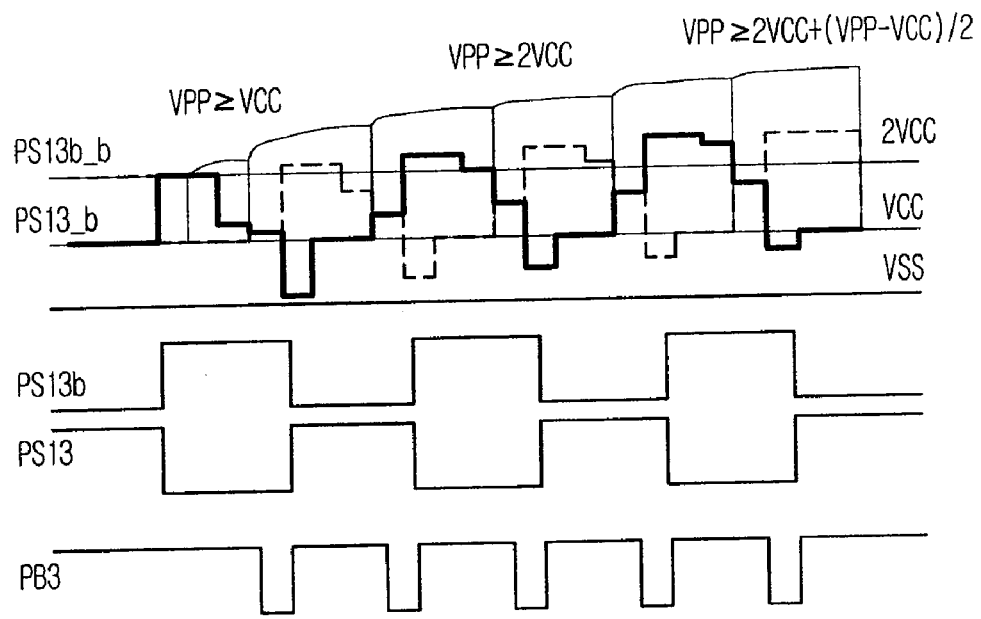
FIGS. 29A and 29B are waveforms demonstrating the operation of the charge pump shown in FIG. 28A.
Figure 29B:
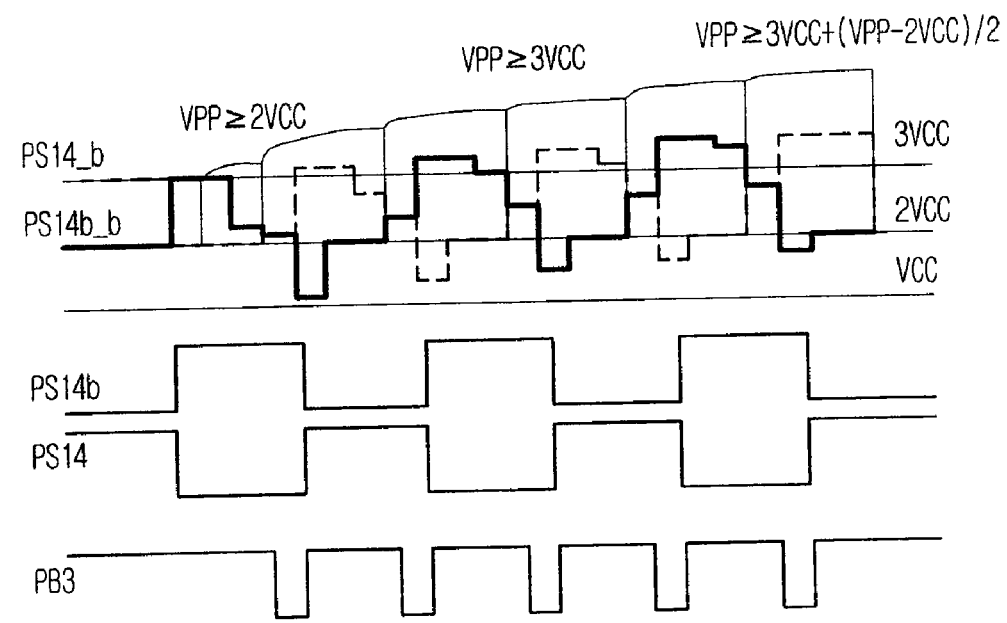

FIGS. 29A and 29B are waveforms demonstrating the operation of the charge pump 340A shown in FIG. 28A.

When the fifteenth precharge control signal G15 is changed from the ground voltage VSS level to the power supply voltage VCC level, the fifty third NMOS transistor N53 is turned on to thereby precharge the thirteenth bootstrapping node PS13_b into the power supply voltage VCC level. Then, when the fifteenth precharge control signal G15 is changed from the power supply voltage VCC level to the ground voltage VSS level, the fifty third NMOS transistor N53 is turned off. After thirteenth pumping control signal PS13 is changed from the ground voltage VSS level to the power supply voltage VCC level, the thirteenth bootstrapped node PS13_b is bootstrapped into the double power supply voltage 2VCC level.

When the sixteenth precharge control signal G16 is changed from the ground voltage VSS level to the power supply voltage VCC level, the fifty fourth NMOS transistor N54 is turned on to thereby precharge the fourteenth bootstrapping node PS14_b with the power supply voltage VCC level. Then, the sixteenth precharge control signal G16 is changed from the power supply voltage VCC level to the ground voltage VSS level, the fifty fourth NMOS transistor N54 is turned off. After the fourteenth pumping control signal PS14 is changed from the ground voltage VSS level to the power supply voltage VCC level, the fourteenth bootstrapping node PS14_b is bootstrapped into the double power supply voltage 2VCC level.

Finally, when the seventeenth precharge control signal G17 is changed from the ground voltage VSS level into the power supply voltage VCC level, the charge sharing occurs between the fourteenth bootstrapping node PS14_b and the pumping voltage VPP. Concurrently, the fifteenth precharge control signal G15 is also changed from the ground voltage VSS level into the power supply voltage VCC level.

Therefore, the thirteenth bootstrapping node PS13_b is precharged with the voltage level of the fourteenth bootstrapping node PS14_b. Then, the thirteenth pair of bootstrapping node PS13_b and PS13b_b is charge-shared with each other in response to the third precharge signal PB3 having the logic level 'L'. Thus, the voltage level of the thirteenth pair of bootstrapping node PS13_b and PS13b_b become (VCC+(VPS14_b−VCC)/2) level. Therefore, the bootstrapping node PS13b_b can be bootstrapped into (2VCC+(VPS14_b−VCC)/2) level when the pumping control signal PS13b is changed from the ground voltage VSS level into the power supply voltage VCC level. Herein, VPS14_b denotes the voltage loaded in the fifteenth bootstrapping node PS14_b.

In the same way, after precharged with the double power supply voltage VCC level in response to the sixteenth precharge control signal G16, the fourteenth bootstrapping node PS14_b is further precharged with the bootstrapping node PS14b_b in response to the third precharge signal PB3 having the logic level 'L'. Thus, the voltage levels of the bootstrapping nodes PS14_b and PS14b_b become (2VCC+(VPP−2VCC)/2) level. Therefore, the pumping voltage VPP can be increased up to (3VCC+(VPP−2VCC)/2) level.

As shown in FIG. 29A, the thirteenth pair of bootstrapping node PS13_b and PS13b_b can be bootstrapped into (2VCC+(VPS14b_b−VCC)/2) level and (2VCC+(VPS14_b−VCC)/2) level and can be precharged with (VCC+(VPS14b_b−VCC)/2) level and (VCC+(PS14_b−VCC)/2) level respectively. Herein, VPS14b_bdenotes a voltage loaded in the bootstrapping node PS14b_b.

Further, as shown in FIG. 29B, the fourteenth pair of bootstrapping node PS14_b and PS14b_b can be bootstrapped into (3VCC+(VPP−2VCC)/2) level and can be precharged with (2VCC+(VPP−2VCC)/2) level. Therefore, the pumping voltage VPP can be increased up to (3VCC+(VPP−2VCC)/2) level.

As a result, the current efficiency of the charge pump 340 shown in FIG. 26 is determined by the following equation ((((3VCC−VPP)+(VPP−2VCC)/2)×C)/3VCC×C)×100). Further, the theoretical maximum level of the pumping value VPP is (3VCC+(VPP−2VCC)/2). For example, when the power supply voltage VCC is about 1.5V and the target level of the pumping voltage VPP is about 3.5V, the current efficiency becomes about 33%; and the theoretical maximum level of the pumping voltage VPP is about 5V.

Figure 30:
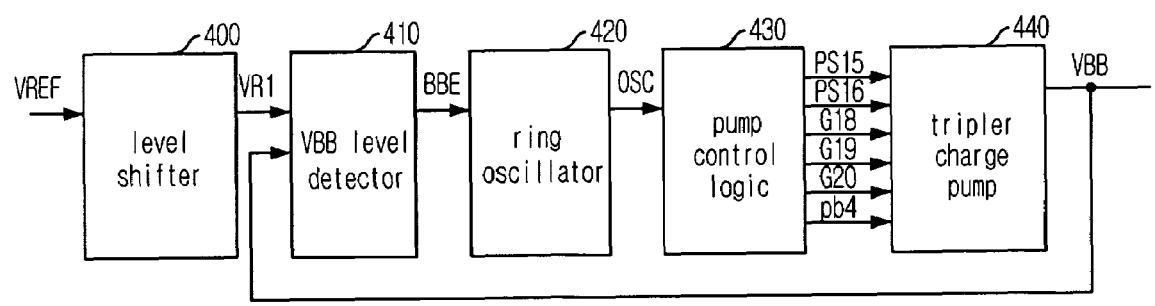
FIG. 30 is a block diagram describing a tripler back bias voltage generator in accordance with a preferred embodiment of the present invention.

FIG. 30 is a block diagram describing a tripler back bias voltage generator in accordance with a preferred embodiment of the present invention.

As shown, the tripler back bias voltage generator includes a level shifter 400, a VBB level detector 410, a ring oscillator 420, a pump control logic 430, and a tripler charge pump 440.

The level shifter 400 outputs a shifted reference voltage VR1 by level shifting a reference voltage VREF. The VBB level detector 410 detects a level of the back voltage VBB in response to the shifted reference voltage VR1 to thereby output a back bias enable signal BBE. The ring oscillator 420 generates an oscillation signal OSC in response to the back bias enable signal BBE. The pump control logic 430 generates pumping control signals PS15, PS16, G18, G19, and G20 and a fourth precharge signal PB4 in response to the oscillation signal OSC. The tripler charge pump 440 generates the pumping voltage VPP in response to the control signals PS15, PS16, G18, G19, and G20 and a fourth precharge signal PB4 to thereby transmit the back bias voltage VBB to the VBB level detector 410.

Herein, the level shifter 400, the VBB level detector 410, and the ring oscillator 420 is similar with those shown in FIG. 21.

Figure 31A:
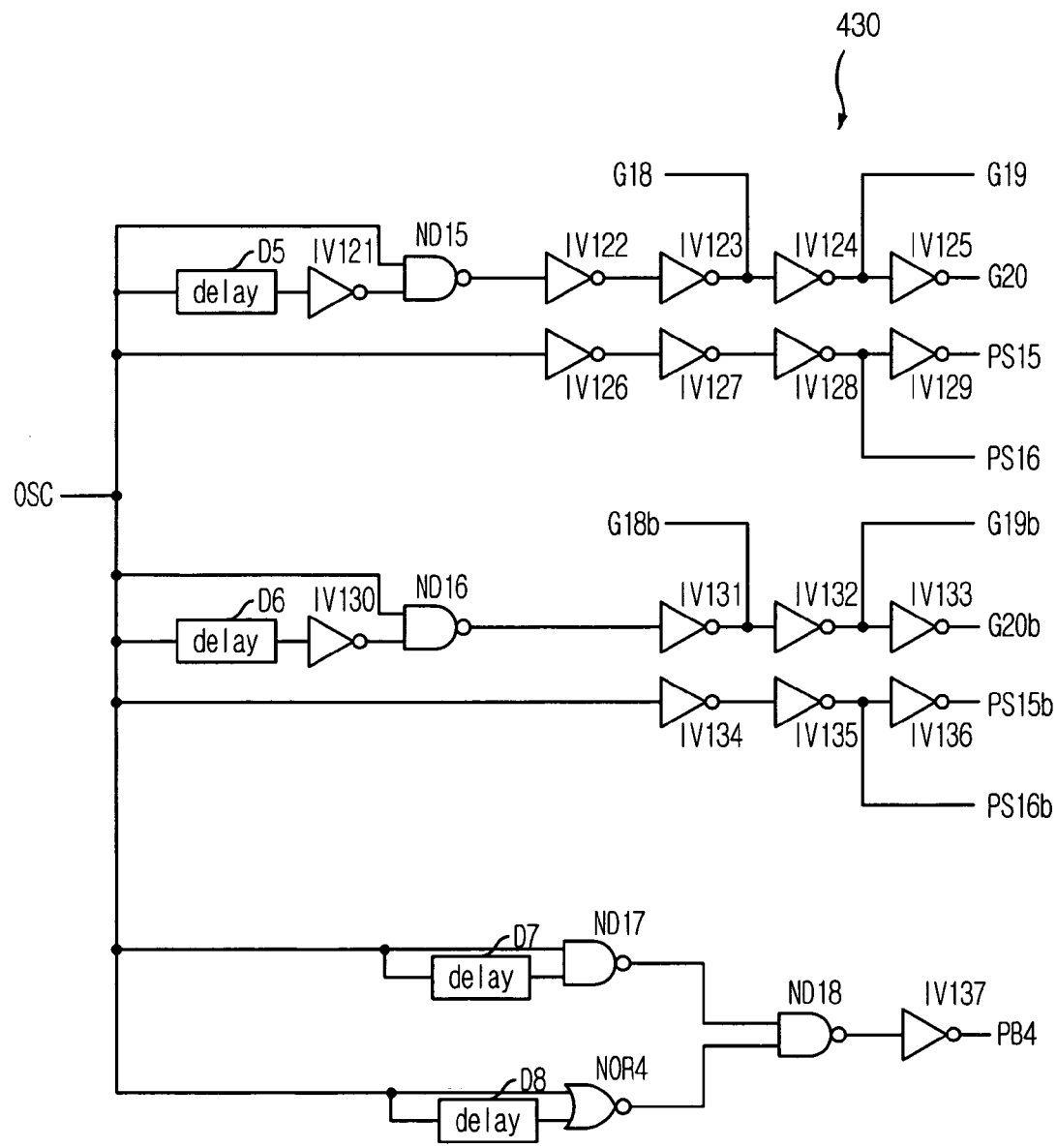
FIG. 31A is a schematic circuit diagram describing a pump control logic shown in FIG. 30.
Figure 31B:
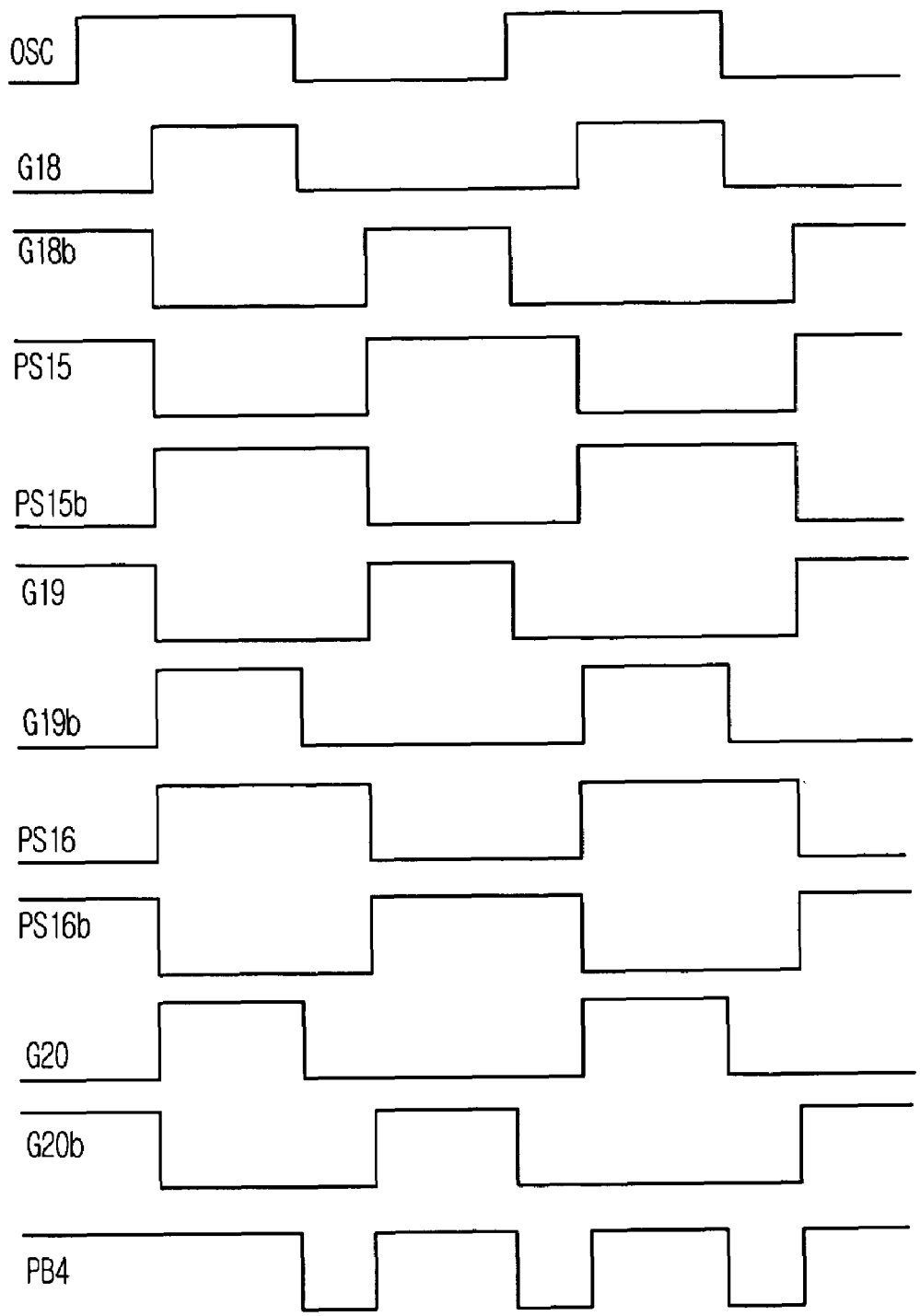
FIG. 31B is a waveform demonstrating an operation thereof.

FIG. 31A is a schematic circuit diagram describing the pump control logic 430 shown in FIG. 30, and FIG. 31B is a waveform demonstrating an operation thereof, respectively.

As shown in FIG. 31A, the pump control logic 430 is provided with seventeen inverters IV121 to IV137, four NAND gates ND15 and ND18, four delays D5 to D8, and a NOR gate NOR4.

The pump control logic 430 shown in FIG. 31A generates the pumping control signals PS15, PS16, G18, G19, and G20 and a fourth precharge signal PB4 shown in FIG. 31B in response to the oscillation signal OSC. Herein, the pumping control signals PS15, PS16, G18, G19, and G20 are of opposite phase with those of the pumping control signals PS15b, PS16b, G18b, G19b, and G20b.

Figure 32A:
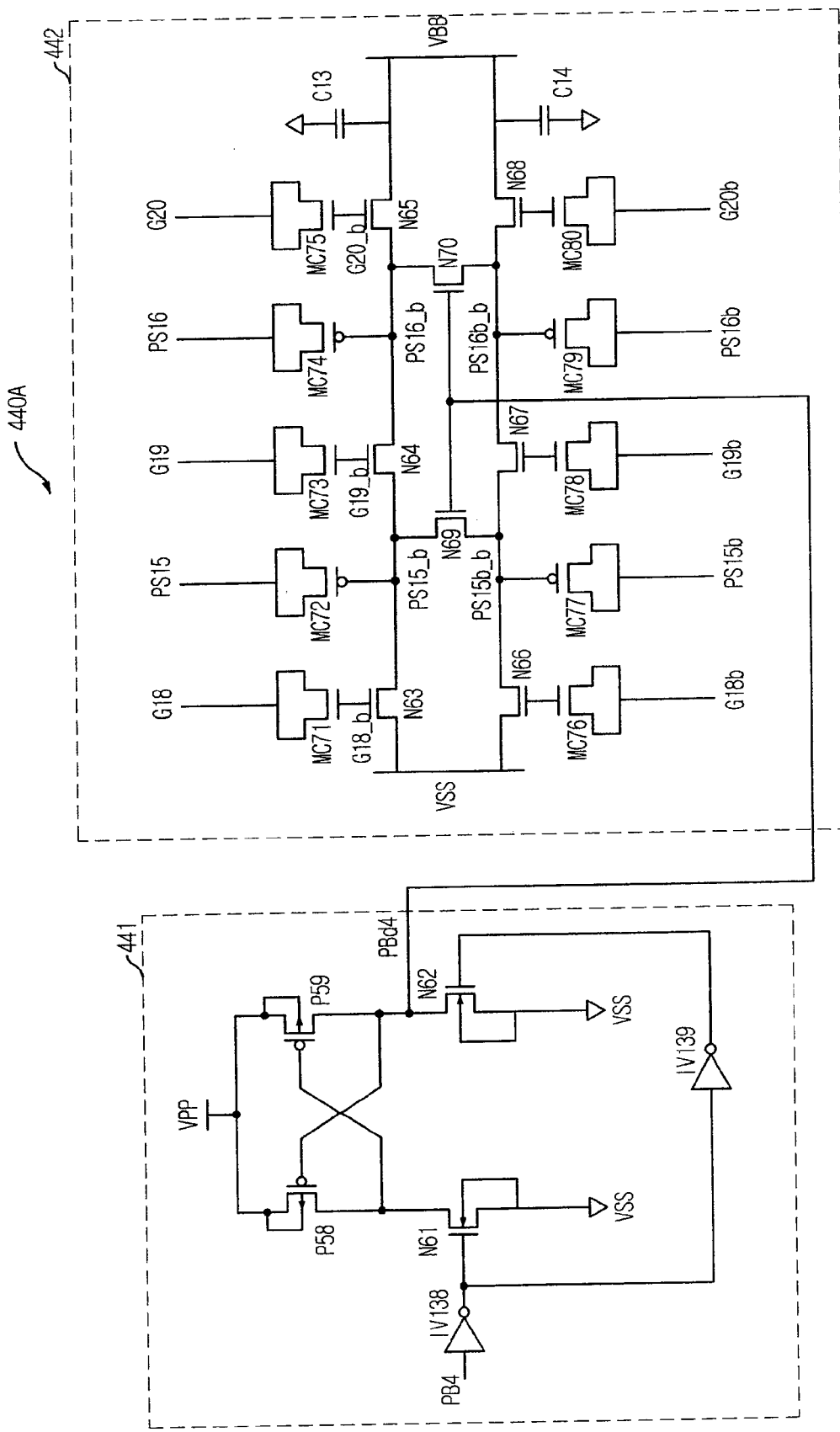
FIGS. 32A and 32B are schematic circuit diagrams of a tripler charge pump shown in FIG. 30 in accordance with a first and a second embodiments, respectively.
Figure 32B:
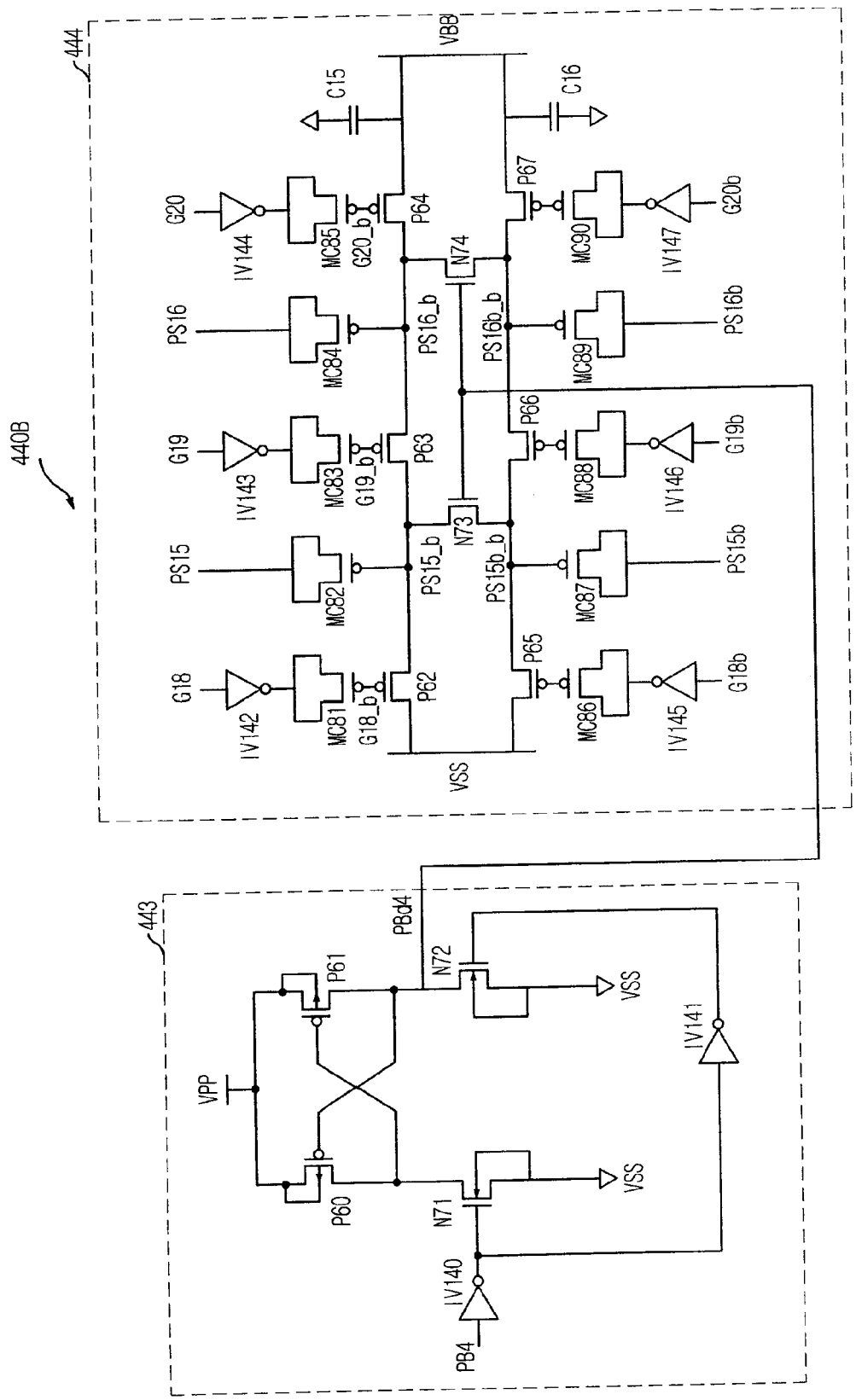

FIGS. 32A and 32B are schematic circuit diagrams of the tripler charge pump 440 shown in FIG. 30 in accordance with a first and a second embodiments, respectively.

First, as shown in FIG. 32A, the tripler charge pump 440A includes a first precharge controller 441 and a first charge pump 442. The first precharge controller 441 is provided with two PMOS transistors P58 and P59, two NMOS transistors N61 and N62, and two inverters INV138 and IV39. The first charge pump 442 is provided with eight NMOS transistors N63 to N70, ten MOS capacitors MC71 to MC80, and two capacitors C13 and C14.

In the first precharge controller 441, the PMOS transistors P58 and P59 are parallel connected each other and are coupled to the pumping voltage VPP. The sixty first NMOS transistor N61, connected between the fifth eighth PMOS transistor P58 and the ground voltage VSS, receives the fourth precharge signal PB4 outputted from the pump control logic 430 through a gate. The sixty second NMOS transistor N62, connected between the fifty nine PMOS transistor P59 and the ground voltage VSS, receives the inverted fourth precharge signal PB4, delayed by the two inverters IV138 and IV139, through a gate. Further, a fourth precharge drive signal PBd4 is outputted through a common node of the fifty ninth PMOS transistor P59 and the sixty second NMOS transistor N62.

Figure 13A:
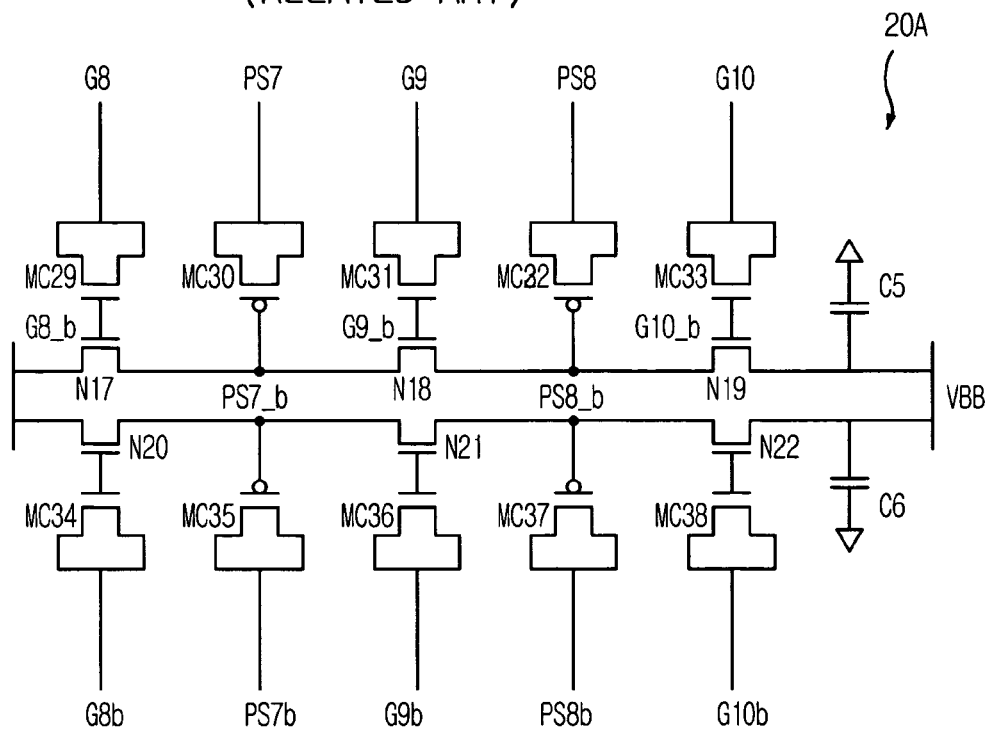
FIGS. 13A and 13B are schematic circuit diagrams of a tripler charge pump shown in FIG. 11 in accordance with a first and a second embodiments, respectively.

Further, as compared with the charge pump 20A shown in FIG. 13A, the first charge pump 442 further includes two NMOS transistors N69 and N70. The sixty ninth NMOS transistor N69 is connected between the bootstrapping nodes PS15_b and PS15b_b; and the seventieth PMOS transistor N70 is connected between the bootstrapping nodes PS16_b and PS16b_b.

Meanwhile, as shown in FIG. 32B, the tripler charge pump 440B includes a second precharge controller 443 and a second charge pump 444. The second precharge controller 443 is provided with two PMOS transistors P60 and P61, two NMOS transistors N71 and N72, and two inverters IV140 and INV41. The second charge pump 444 is provided with six PMOS transistors P62 to P67, ten MOS capacitors MC81 to MC90, six inverters INV142 to INV147, two NMOS transistors N73 and N74, and two capacitors C15 and C16.

In the second precharge controller 443, the PMOS transistors P60 and P61 are parallel connected each other and are coupled to the pumping voltage VPP. The seventy first NMOS transistor N71, connected between the sixtieth PMOS transistor P60 and the ground voltage VSS, receives the fourth precharge signal PB4 outputted from the pump control logic 430 through a gate. The seventy second NMOS transistor N72, connected between the sixty first PMOS transistor P61 and the ground voltage VSS, receives the delayed fourth precharge signal PB4, delayed by the two inverters IV140 and IV141, through a gate. Further, a fourth precharge drive signal PBd4 is outputted through a common node of the sixty first PMOS transistor P61 and the seventy second NMOS transistor N72.

Figure 13B:
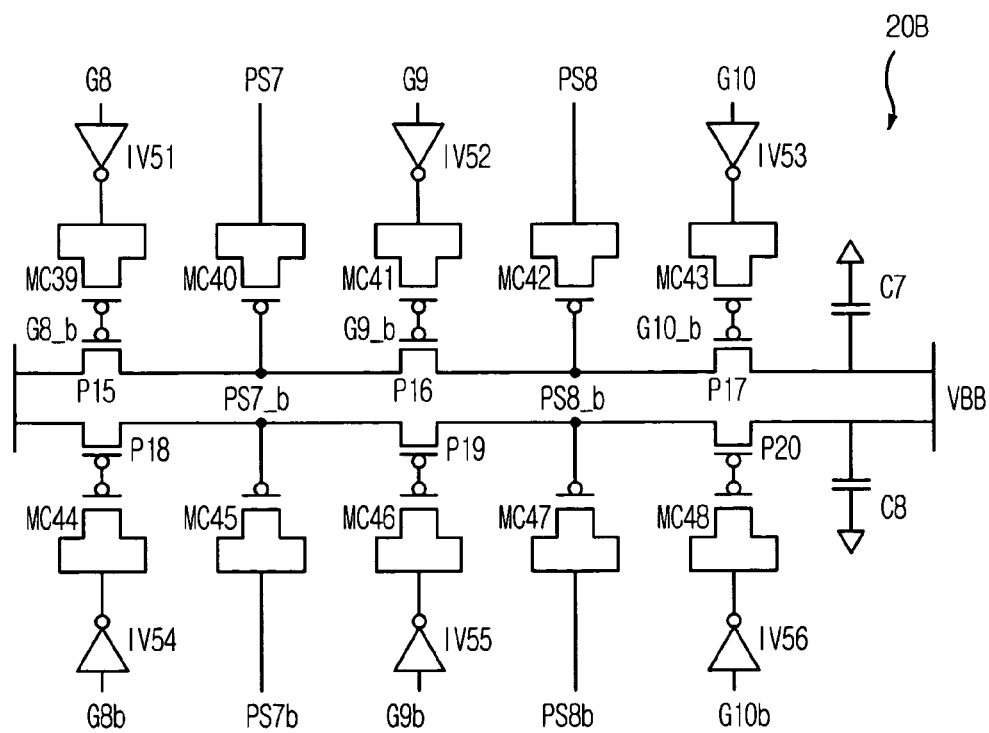
Figure 14A:
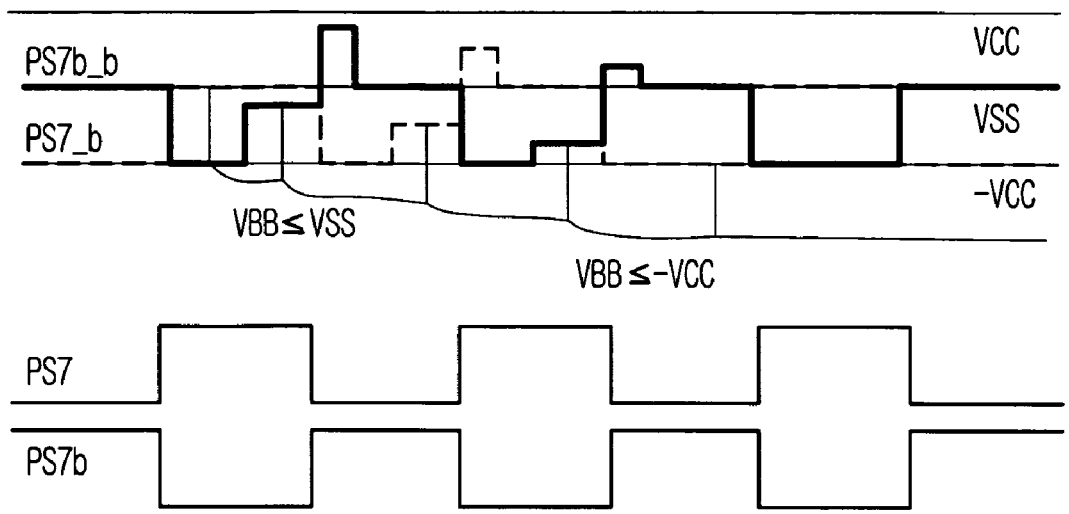
FIGS. 14A and 14B are waveforms demonstrating an operation of the tripler charge pump shown in FIG. 13A.
Figure 14B:
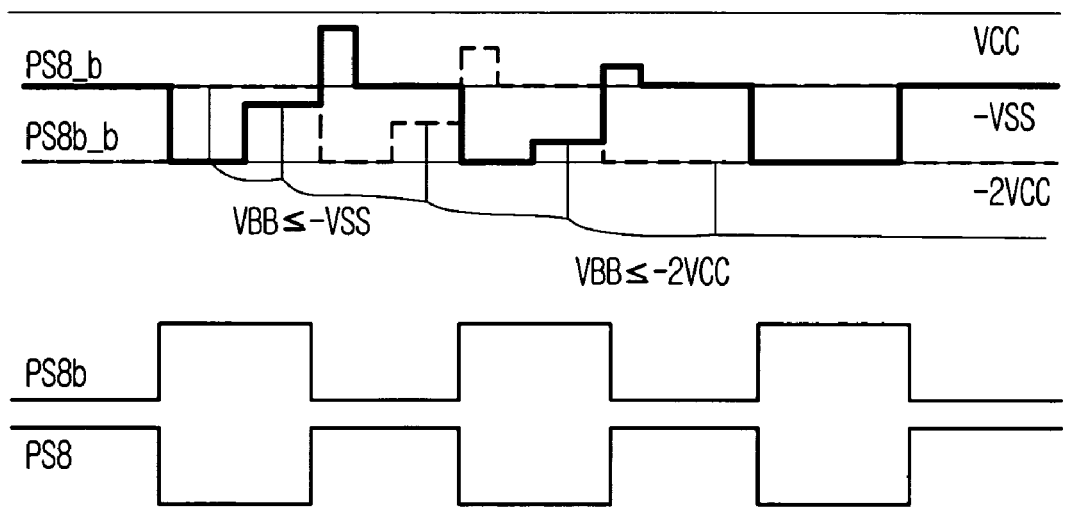

Further, as compared with the charge pump 20B shown in FIG. 13B, the second charge pump 444 further includes two NMOS transistors N73 and N74. The seventy third PMOS transistor P73 is connected between the bootstrapping nodes PS15_b and PS15b_b; and the seventy fourth PMOS transistor P74 is connected between the bootstrapping nodes PS16_b and PS16b_b.

The first and the second precharge controllers 441 and 443 have substantially the same structure; and the first and the second charge pumps 442 and 444 have almost substantially the same structure. However, while the precharge control signals G18 to G20b inputted to the first charge pump 442 are directly inputted through the MOS capacitors MC71 to MC80 to thereby control the NMOS transistors N63 to N68, the precharge control signals G18 to G20b are inputted to the MOS capacitors MC81 to MC90 via the inverters IV142 to IV147 to thereby control the PMOS transistors P62 to P67 in the second charge pump 444. As a result, the first and the second charge pumps 442 and 444 perform substantially the same operation.

That is, the fourth precharge signal PB4 is inputted to the tripler charge pump 440 to thereby increase the current efficiency by reusing the electric charge, remained in the bootstrapping nodes PS15_b to PS16b_b.

Hereinafter, the operation of the charge pump is explained.

When the eighteenth precharge control signal G18 is changed from the ground voltage VSS level to the power supply voltage VCC level, the sixty third NMOS transistor N63 is turned on to precharge the fifteenth bootstrapping node PS15_b with the power supply voltage VCC level. Then, when the eighteenth precharge control signal G18 is changed from the power supply voltage VCC level to the ground voltage VSS level, the sixty third NMOS transistor N63 is turned off. After fifteenth pumping control signal PS15 is changed from the ground voltage VSS level to the power supply voltage VCC level, the fifteenth bootstrapped node PS15_b is bootstrapped into the negative power supply voltage −VCC level.

When the nineteenth precharge control signal G19 is changed from the ground voltage VSS level to the power supply voltage VCC level, the sixty fourth NMOS transistor N64 is turned on to precharge the sixteenth bootstrapping node PS16_b with the power supply voltage VCC level. Further, the fifteenth bootstrapping node PS15_b of the negative power supply voltage VCC level is precharged with the sixteenth bootstrapping node PS16_b with the ground voltage VSS level.

Then, the nineteenth precharge control signal G19 is changed from the power supply voltage VCC level to the ground voltage VSS level, the sixty fourth NMOS transistor N64 is turned off. After the sixteenth pumping control signal PS16 is changed from the power supply voltage VCC level to the ground voltage VSS level, the sixteenth bootstrapping node PS16_b is bootstrapped into the negative power supply voltage −VCC level.

Finally, when the twentieth precharge control signal G20 is changed from the ground voltage VSS level into the power supply voltage VCC level, the charge sharing occurs between the sixteenth bootstrapping node PS16_b and the back bias voltage VBB. Concurrently, the eighteenth precharge control signal G18 is also changed from the ground voltage VSS level into the power supply voltage VCC level.

Therefore, the fifteenth bootstrapping node PS15_b is precharged with the voltage level of the sixteenth bootstrapping node PS16_b. Then, the fifteenth pair of bootstrapping node PS15_b and PS15b_b are charge shared with each other in response to the fourth precharge signal PB4 of the logic level 'L'. Thus, the voltage level of the fifteenth pair of bootstrapping node PS15_b and PS15b_b become ((VPS16_b−(VSS))/2) level. Therefore, the bootstrapping node PS15b_b can be bootstrapped into (−VCC+(VPS16_b−(VSS))/2) level when the pumping control signal PS15b is changed from the power supply voltage VCC level into the ground voltage VSS level. Herein, VPS16_b denotes a voltage loaded at the sixteenth bootstrapping node PS16_b.

In the same way, after precharged with the negative power supply voltage −VCC level in response to the nineteenth precharge control signal G19, the sixteenth bootstrapping node PS16_b is further precharged by the bootstrapping node PS16b_b in response to the fourth precharge signal PB4 of the logic level 'L'. Thus, the voltage level of the bootstrapping nodes PS16_b and PS16b_b become (−VCC+(VBB−(−VSS))/2) level. Therefore, the back bias voltage VBB can be decreased up to (−2VCC+(VBB−(−VCC))/2) level.

As shown in FIG. 29A, the thirteenth pair of bootstrapping node PS13_b and PS13b_b can be bootstrapped into (2VCC+(VPS14b_b−VCC)/2) level and (2VCC+(VPS14_b−VCC)/2) level and can be precharged with (VCC+(VPS14b_b−VCC)/2) level and (VCC+(VPS14_b−VCC)/2) level, respectively. Further, as shown in FIG. 29B, the fourteenth pair of bootstrapping node PS14_b and PS14b_b can be bootstrapped into (3VCC+(VPP−2VCC)/2) level and can be precharged with (2VCC+(VPP−2VCC)/2) level. Therefore, the pumping voltage VPP can be increased up to (3VCC+(VPP−2VCC)/2) level.

Figure 33A:
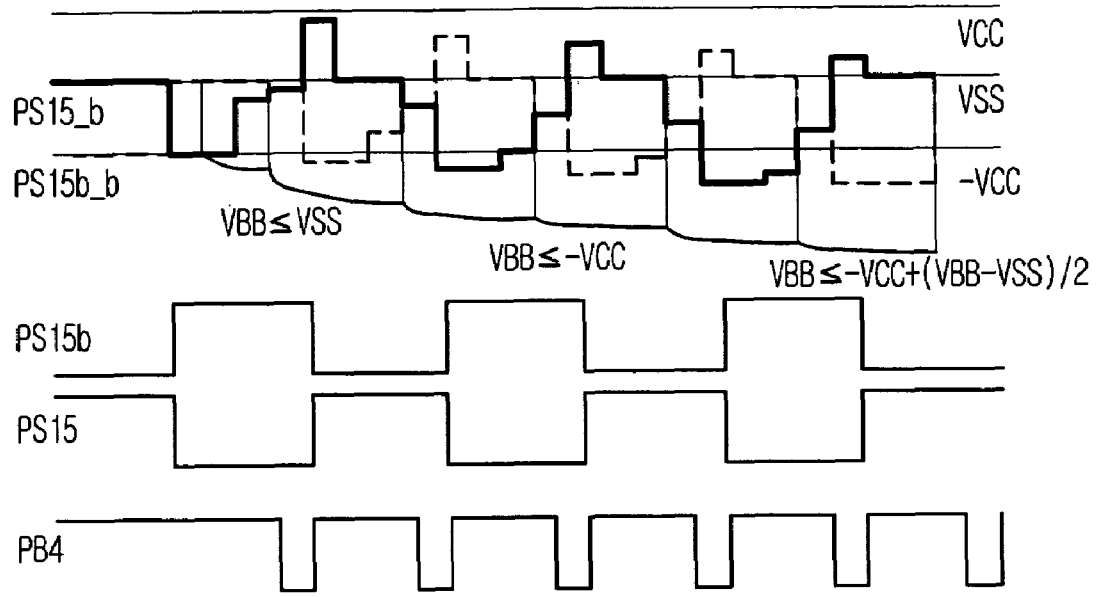
FIGS. 33A and 33B are waveforms demonstrating the operation of the charge pump shown in FIG. 32A.
Figure 33B:
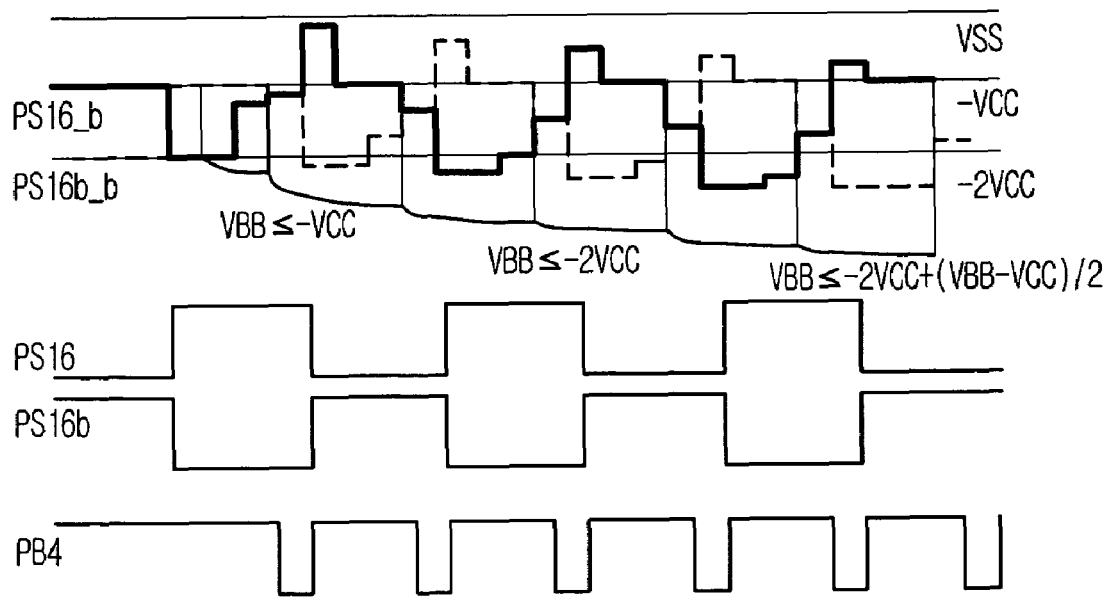

FIGS. 33A and 33B are waveforms demonstrating the operation of the charge pump 440A shown in FIG. 32A.

As shown in FIG. 33A, the fifth pair of bootstrapping node PS15_b and PS15b_b can be bootstrapped into (−VCC+(VPS16b_b−(−VCC))/2) level and (−VCC+(VPS16_b−(−VCC))/2) level and can be precharged with ((VPS16b_b−(−VCC))/2) level and ((VPS16_b−(−VCC))/2) level, respectively. Further, as shown in FIG. 33B, the sixteenth pair of bootstrapping node PS16_b and PS16b_b can be bootstrapped into (−2VCC+(VBB−(−VCC))/2) level and can be precharged with (−VCC+(VBB−(−VCC))/2) level. Therefore, the back bias voltage VBB can be decreased up to (−2VCC+(VBB−(−VCC))/2) level. Herein, VPS16_b and VPS16b_b denote voltages loaded in the sixteenth pair of bootstrapping node PS16_b and PS16b_b, respectively.

As a result, the current efficiency of the charge pump 440 shown in FIG. 30 is defined by the following equation (−((((−2VCC−VBB)+(VBB−(−VCC))/2×C)/−2VCC×C)×100). Further, the theoretical maximum level of the back bias value VBB is (−2VCC+(VBB−(−2VCC))/2). For example, when the power supply voltage VCC is about 1.5V and the target level of the back bias voltage VBB is about −2V, the current efficiency becomes about 50%; and the theoretical maximum level of the back bias voltage VBB is about −3.5V.

As abovementioned, the present invention provides an internal voltage generator including a high efficient charge pump. Therefore, the present invention improves the electric charge driving capability. Further, the present invention generates internal voltages of stable voltage level and reduces a layout area.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator, comprising:
   a periodic signal generation block configured to output a periodic signal in response to a pumping voltage and a reference voltage;
   a pump control logic circuit configured to output a pumping control signal and a precharge signal in response to the periodic signal; and
   a charge pump circuit configured to include a pair of bootstrapping nodes alternately sharing charge with the pumping voltage in response to the pumping control signal, a switch unit sharing charge on the pair of bootstrapping nodes to increase the pumping voltage in response to a precharge drive signal before each bootstrapping node shares the charge with the pumping voltage, and a precharge controller pumping the precharge signal to output the precharge drive signal.

2. The internal voltage generator as recited in claim 1, wherein the periodic signal generation block includes:
   a level shifter for level shifting the reference voltage to thereby generate a shifted reference voltage;
   a pumping voltage level detector for detecting a level of the pumping voltage in response to the shifted reference voltage to thereby output a pumping enable signal; and
   a ring oscillator for generating the periodic signal in response to the pumping enable signal.

3. The internal voltage generator as recited in claim 2, wherein the pump control logic includes:
   a first logic means for delaying the periodic signal for a predetermined time to thereby generate first pumping control signals for bootstrapping the pair of bootstrapping nodes;
   a second logic means for logically combining the periodic signal with a delayed periodic signal to thereby generate second pumping control signals for precharging the pair of bootstrapping nodes bootstrapped in response to the first pumping control signals; and
   a third logic means for logically combining the second pumping control signals with each other to thereby generate the precharge signal.

4. The internal voltage generator as recited in claim 3, wherein the first logic means is provided with a plurality of inverters for generating the first pumping control signals by delaying the periodic signal for the predetermined time, wherein the first pumping control signals are two opposite phases of signals.

5. The internal voltage generator as recited in claim 3, wherein the second logic means is provided with a plurality of logic elements for logically combining the periodic signal and the delayed periodic signal to thereby activate the second pumping control signals prior to rising and falling edges of the periodic signal, respectively.

6. The internal voltage generator as recited in claim 5, wherein the third logic means includes another plurality of logic elements for logically combining the second pumping control signals to respectively activate the precharge signal in response to activation of the second pumping control signals.

7. The internal voltage generator as recited in claim 2, wherein the pump control logic includes:
   a first logic means for delaying the periodic signal for a first predetermined time to thereby generate first pumping control signals for bootstrapping the pair of bootstrapping nodes;
   a second logic means for delaying the periodic signal for a second predetermined time to thereby generate second pumping control signals having an opposite phase of the first pumping control signals, respectively;
   a third logic means for logically combining the periodic signal and a delayed periodic signal to thereby generate third pumping control signals for precharging the pair of bootstrapping nodes into the level of the power supply voltage;
   a fourth logic means for generating fourth pumping control signals having an opposite phase of the third pumping control signals, respectively; and
   a fifth logic means for logically combining the periodic signal and a delayed periodic signal to thereby activate the precharge signal after charge sharing the pair of bootstrapping nodes and the pumping voltage.

8. The internal voltage generator as recited in claim 7, wherein the first logic means is provided with a plurality of inverters for generating the first pumping control signals by delaying the periodic signal for the first predetermined time, wherein the first pumping control signals are two opposite phases of signals.

9. The internal voltage generator as recited in claim 7, wherein the second logic means is provided with a plurality of inverters for generating the second pumping control signals by delaying the periodic signal for the second predetermined time.

10. The internal voltage generator as recited in claim 7, wherein the third logic means includes:
    a first logic block for logically combining the periodic signal and an inverted periodic signal; and
    a plurality of inverters for delaying an output of the first logic block for different predetermined times to thereby output third pumping control signals.

11. The internal voltage generator as recited in claim 7, wherein the fourth logic means includes:
    a first logic block for logically combining the periodic signal and an inverted periodic signal; and
    a plurality of inverters for delaying an output of the first logic block for different predetermined times to thereby output the fourth pumping control signals.

12. The internal voltage generator as recited in claim 7, wherein the fifth logic means includes:
    a first NAND gate for logically combining the periodic signal and the delayed periodic signal;
    a NOR gate for logically combining the periodic signal and the delayed periodic signal; and
    a second NAND gate receiving outputs from the first NAND gate and the NOR gate to thereby output the precharge signal.

13. The internal voltage generator as recited in claim 1, wherein the precharge controller includes:
    first and second PMOS transistors cross coupled to each other and connected to a terminal providing the precharge drive signal; and
    first and second NMOS transistors respectively connected between a ground voltage and the first and second PMOS transistors, the first and second NMOS transistors respectively receiving the precharge signal and an inverted precharge signal through a gate thereof.

14. The internal voltage generator as recited in claim 1, wherein the charge pump circuit is a cross coupled doubler charge pump, which includes:
    a plurality of switches for bootstrapping the pair of bootstrapping nodes by increasing a power supply voltage; and
    a plurality of MOS capacitors for selectively charging the pair of bootstrapping nodes in response to the precharge signal.

15. The internal voltage generator as recited in claim 1, wherein the charge pump circuit is a tripler charge pump, which includes:
    a plurality of switches, sequentially turned on, for bootstrapping the pair of bootstrapping nodes by increasing a power supply voltage; and
    a plurality of MOS capacitors for selectively charging the pair of bootstrapping nodes in response to the precharge signal when the corresponding switch is turned on.

16. An internal voltage generator, comprising:
a periodic signal generation block for detecting a level of a back bias voltage by using a reference voltage to thereby output a periodic signal;
a pump control logic for outputting a pumping control signal and a precharge signal in response to the periodic signal; and
a charge pump including a pair of bootstrapping nodes alternately sharing charge with the back bias voltage in response to the pumping control signal, and a switch unit sharing charge on the pair of bootstrapping nodes to decrease the back bias voltage in response to a precharge drive signal before each bootstrapping node shares the charge with the back bias voltage, and a precharge controller pumping the precharge signal to output the precharge drive signal.

17. The internal voltage generator as recited in claim 16, wherein the periodic signal generation block includes:
a level shifter for level shifting the reference voltage to thereby generate a shifted reference voltage;
a back bias voltage level detector for detecting a level of the back bias voltage in response to the shifted reference voltage to thereby output a back bias enable signal; and
a ring oscillator for generating the periodic signal in response to the back bias enable signal.

18. The internal voltage generator as recited in claim 17, wherein the pump control logic includes:
a first logic means for delaying the periodic signal for a predetermined time to thereby generate first pumping control signals for bootstrapping the pair of bootstrapping nodes;
a second logic means for logically combining the periodic signal with a delayed periodic signal to thereby generate second pumping control signals for precharging the pair of bootstrapping nodes bootstrapped in response to the first pumping control signals; and
a third logic means for logically combining the second pumping control signals with each other to thereby generate the precharge signal.

19. The internal voltage generator as recited in claim 18, wherein the first logic means is provided with a plurality of inverters for generating the first pumping control signals by delaying the periodic signal for the predetermined time, wherein the first pumping control signals are two opposite phase of signals.

20. The internal voltage generator as recited in claim 18, wherein the second logic means is provided with a plurality of logic elements for logically combining the periodic signal and the delayed periodic signal to thereby activate the second pumping control signals prior to rising and falling edges of the periodic signal, respectively.

21. The internal voltage generator as recited in claim 20, wherein the third logic means includes another plurality of logic elements for logically combining the second pumping control signals to respectively activate the precharge signal in response to activation of the second pumping control signals.

22. The internal voltage generator as recited in claim 17, wherein the pump control logic includes:
a first logic means for delaying the periodic signal for a predetermined time to thereby generate first pumping control signals for bootstrapping the pair of bootstrapping nodes;
a second logic means for delaying the periodic signal for a predetermined time to thereby generates second pumping control signals having an opposite phase of the first pumping control signals, respectively;
a third logic means for logically combining the periodic signal and a delayed periodic signal to thereby generate third pumping control signals for precharging the pair of bootstrapping nodes into the level of the power supply voltage;
a fourth logic means for generating fourth pumping control signals having an opposite phase of the third pumping control signals, respectively; and
a fifth logic means for logically combining the periodic signal and a delayed periodic signal to thereby activate the precharge signal after charge sharing the pair of bootstrapping nodes and the back bias voltage.

23. The internal voltage generator as recited in claim 22, wherein the first logic means is provided with a plurality of inverters for generating the first pumping control signals by delaying the periodic signal for the predetermined time, wherein the first pumping control signals are two opposite phases of signals.

24. The internal voltage generator as recited in claim 22, wherein the second logic means is provided with a plurality of inverters for generating the second pumping control signals by delaying the periodic signal for the predetermined time.

25. The internal voltage generator as recited in claim 22, wherein the third logic means includes:
a first logic block for logically combining the periodic signal and an inverted periodic signal; and
a plurality of inverters for delaying an output of the first logic block for different predetermined times to thereby output-the third pumping control signals.

26. The internal voltage generator as recited in claim 22, wherein the fourth logic means includes:
a first logic block for logically combining the periodic signal and an inverted periodic signal; and
a plurality of inverters for delaying an output of the first logic block for different predetermined times to thereby output the fourth pumping control signals.

27. The internal voltage generator as recited in claim 22, wherein the fifth logic means includes:
a first NAND gate for logically combining the periodic signal and the delayed periodic signal;
a NOR gate for logically combining the periodic signal and the delayed periodic signal; and
a second NANP gate receiving outputs from the first NAND gate and the NOR gate to thereby output the precharge signal.

28. The internal voltage generator as recited in claim 16, wherein the precharge controller includes:
first and second PMOS transistors cross coupled to each other and connected to a terminal providing a precharge drive signal; and
first and second NMOS transistors respectively connected between a ground voltage and the first and second PMOS transistors, the first and second NMOS transistors respectively receiving the precharge signal and a delayed precharge signal through a gate thereof.

29. The internal voltage generator as recited in claim 16, wherein the charge pump is a cross coupled doubler charge pump, which includes:
a plurality of switches for bootstrapping the pair of bootstrapping nodes by pumping ground voltage; and a plurality of MOS capacitors for selectively charging the pair of bootstrapping nodes in response to the precharge signal.

30. The internal voltage generator as recited in claim 16, wherein the charge pump is a tripler charge pump, which includes:

a plurality of switches, sequentially turned on, for bootstrapping the pair of bootstrapping nodes by pumping a ground voltage; and a plurality of MOS capacitors for selectively charging the pair of bootstrapping nodes in response to the precharge signal when the corresponding switch is turned on.

* * * * *